US011557358B2

(12) United States Patent
Zhao et al.

(10) Patent No.: US 11,557,358 B2
(45) Date of Patent: Jan. 17, 2023

(54) MEMORY APPARATUS AND METHOD OF OPERATION USING ADAPTIVE ERASE TIME COMPENSATION FOR SEGMENTED ERASE

(71) Applicant: SanDisk Technologies LLC, Addison, TX (US)

(72) Inventors: Dengtao Zhao, Los Gatos, CA (US); Deepanshu Dutta, Fremont, CA (US); Ravi Kumar, Redwood City, CA (US)

(73) Assignee: SanDisk Technologies LLC, Addison, TX (US)

( * ) Notice: Subject to any disclaimer, the term of this patent is extended or adjusted under 35 U.S.C. 154(b) by 69 days.

(21) Appl. No.: 17/231,071

(22) Filed: Apr. 15, 2021

(65) Prior Publication Data

US 2022/0336029 A1 Oct. 20, 2022

(51) Int. Cl.
*G11C 16/16* (2006.01)
*G11C 16/34* (2006.01)
*G11C 16/04* (2006.01)

(52) U.S. Cl.
CPC ...... *G11C 16/3477* (2013.01); *G11C 16/0483* (2013.01); *G11C 16/16* (2013.01)

(58) Field of Classification Search
CPC .. G11C 16/3477; G11C 16/0483; G11C 16/16
USPC ...................................................... 365/185.3
See application file for complete search history.

(56) References Cited

U.S. PATENT DOCUMENTS

| | | | |
|---|---|---|---|
| 5,831,905 A | * | 11/1998 | Hirano ................... G11C 16/16 |
| | | | 365/185.24 |
| 6,222,762 B1 | | 4/2001 | Guterman et al. |
| 7,023,736 B2 | | 4/2006 | Cernea et al. |
| 7,196,928 B2 | | 3/2007 | Chen |
| 7,196,931 B2 | | 3/2007 | Cernea et al. |
| 7,237,074 B2 | | 6/2007 | Guterman et al. |
| 8,130,551 B2 | | 3/2012 | Oowada et al. |
| 8,958,249 B2 | | 2/2015 | Dutta et al. |
| 9,223,514 B2 | | 12/2015 | Hyun et al. |
| 9,224,494 B2 | | 12/2015 | Chin et al. |
| 9,236,139 B1 | * | 1/2016 | Lai ....................... G11C 16/0483 |
| 9,240,241 B2 | | 1/2016 | Costa et al. |
| 9,343,160 B1 | * | 5/2016 | Dutta ....................... G11C 16/14 |
| 9,645,744 B2 | | 5/2017 | Ellis et al. |

(Continued)

*Primary Examiner* — Huan Hoang
*Assistant Examiner* — Minh Dinh
(74) *Attorney, Agent, or Firm* — Dickinson Wright PLLC; Steven C. Hurles

(57) ABSTRACT

A memory apparatus and method of operation is provided. The apparatus includes memory cells connected to word lines and bit lines and arranged in strings and configured to retain a threshold voltage. Each of the memory cells is configured to be erased in an erase operation occurring during an erase time period. A control circuit is configured to adjust at least a portion of the erase time period in response to determining the erase operation is a segmented erase operation and is resumed after being suspended. The control circuit applies an erase signal having a plurality of voltage segments temporally separated from one another during the erase time period to each of the strings while simultaneously applying a word line erase voltage to selected ones of the word lines to encourage erasing of the memory cells coupled to the selected ones of the word lines in the segmented erase operation.

20 Claims, 18 Drawing Sheets

(56) References Cited

U.S. PATENT DOCUMENTS

| | | |
|---|---|---|
| 2005/0169082 A1 | 8/2005 | Cernea |
| 2013/0163336 A1 | 6/2013 | Li et al. |
| 2013/0279257 A1 | 10/2013 | Costa et al. |
| 2021/0173580 A1* | 6/2021 | Guda .................... G06F 3/0659 |

* cited by examiner

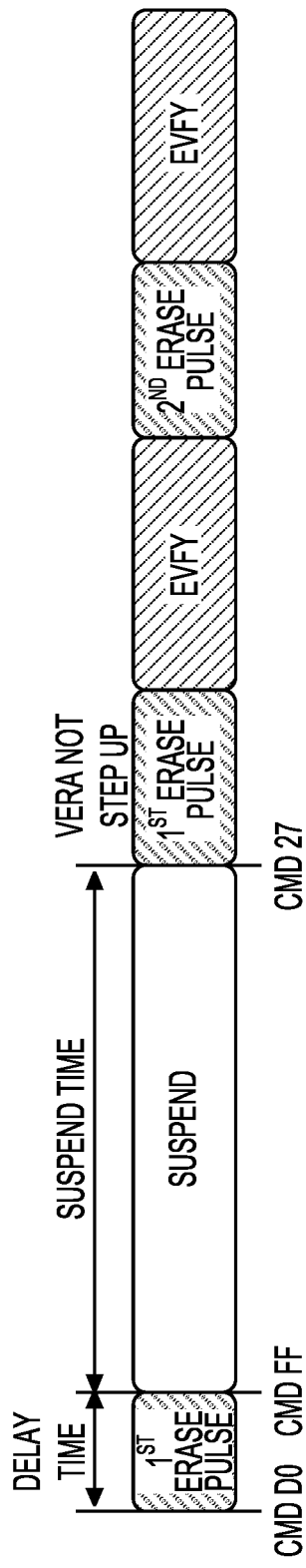
*FIG. 10*
*FIG. 11A*
*FIG. 11B*

| ADD=XXH | | | | | | | | DNTME_RESUME | |
|---|---|---|---|---|---|---|---|---|---|
| [7] | [6] | [5] | [4] | [3] | [2] | [1] | [0] | TIME[US] | DELTA NTME |
| | | | | | 0 | 0 | 0 | T1 | DT1 |
| | | | | | 0 | 0 | 1 | T2 | DT2 |
| | | | | | 0 | 1 | 0 | T3 | DT3 |
| | | | | | 0 | 1 | 1 | T4 | DT4 |
| | | | | | 1 | 0 | 0 | T5 | DT5 |
| | | | | | 1 | 0 | 1 | T6 | DT6 |
| | | | | | 1 | 1 | 0 | T7 | DT7 |
| | | | | | 1 | 1 | 1 | T8 | DT8 |
| | | | | 1 | 0 | 0 | 0 | T9 | DT9 |
| | | | | 1 | 0 | 0 | 1 | T10 | DT10 |
| | | | | 1 | 0 | 1 | 0 | T11 | DT11 |
| | | | | 1 | 0 | 1 | 1 | T12 | DT12 |
| | | | | 1 | 1 | 0 | 0 | T13 | DT13 |
| | | | | 1 | 1 | 0 | 1 | T14 | DT14 |
| | | | | 1 | 1 | 1 | 0 | T15 | DT15 |
| | | | | 1 | 1 | 1 | 1 | T16 | DT16 |

FIG. 19

| ADD=XXH | | | | | | | | EXTRA_SEGMENT |
|---|---|---|---|---|---|---|---|---|
| [7] | [6] | [5] | [4] | [3] | [2] | [1] | [0] | EXTRA ERASE SEGMENT |
| | | | | | | 0 | 0 | 0 |
| | | | | | | 0 | 1 | 1 |
| | | | | | | 1 | 0 | 2 |
| | | | | | | 1 | 1 | 3 |

FIG. 20

MEMORY APPARATUS AND METHOD OF OPERATION USING ADAPTIVE ERASE TIME COMPENSATION FOR SEGMENTED ERASE

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate or charge trapping layer that is positioned above and insulated from a channel region in a semiconductor substrate. The floating gate or charge trapping layer is positioned between the source and drain regions. A control gate is provided over and insulated from the floating gate or charge trapping layer. The threshold voltage ($V_{TH}$) of the transistor thus formed is controlled by the amount of charge that is retained on the floating gate or charge trapping layer. That is, the minimum amount of voltage that must be applied to the control gate before the transistor is turned on to permit conduction between its source and drain is controlled by the level of charge on the floating gate or charge trapping layer.

Some EEPROM and flash memory devices have a floating gate or charge trapping layer that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate or charge trapping layer. When electrons accumulate in the floating gate or charge trapping layer, the floating gate or charge trapping layer becomes negatively charged and the threshold voltage of the memory element is raised so that the memory element is considered to be in a programmed state.

Erasing the memory cells can be achieved by removing the electrons from the floating gate or charge trapping layer, thereby lowering the threshold voltage. Memory operations of memory devices, such as erasing, with a lower relative priority may also be suspended and later resumed while higher priority operations are completed. However, various challenges arise depending on how the operations are carried out, suspended, and resumed.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells connected to word lines and bit lines and arranged in strings and configured to retain a threshold voltage. Each of the memory cells is configured to be erased in an erase operation occurring during an erase time period. A control circuit is coupled to the word lines and the strings and is configured to adjust at least a portion of the erase time period in response to determining the erase operation is a segmented erase operation and is resumed after being suspended. The control circuit is also configured to apply an erase signal having a plurality of voltage segments temporally separated from one another during the erase time period to each of the strings while simultaneously applying a word line erase voltage to selected ones of the word lines to encourage erasing of the memory cells coupled to the selected ones of the word lines in the segmented erase operation.

According to another aspect of the disclosure, a controller in communication with a memory apparatus including memory cells connected to word lines and bit lines and arranged in strings and configured to retain a threshold voltage is also provided. Each of the memory cells is configured to be erased in an erase operation occurring during an erase time period. The controller is configured to instruct the memory apparatus to adjust at least a portion of the erase time period in response to determining the erase operation is a segmented erase operation and is resumed after being suspended. In addition, the controller is configured to instruct the memory apparatus to apply an erase signal having a plurality of voltage segments temporally separated from one another during the erase time period to each of the strings while simultaneously applying a word line erase voltage to selected ones of the word lines to encourage erasing of the memory cells coupled to the selected ones of the word lines in the segmented erase operation.

According to an additional aspect of the disclosure, a method of operating a memory apparatus is provided. The memory apparatus includes memory cells connected to word lines and bit lines and arranged in strings and configured to retain a threshold voltage. Each of the memory cells is configured to be erased in an erase operation occurring during an erase time period. The method includes the step of adjusting at least a portion of the erase time period in response to determining the erase operation is a segmented erase operation and is resumed after being suspended. The method continues with the step of applying an erase signal having a plurality of voltage segments temporally separated from one another during the erase time period to each of the strings while simultaneously applying a word line erase voltage to selected ones of the word lines to encourage erasing of the memory cells coupled to the selected ones of the word lines in the segmented erase operation.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 10 shows a sequence of an erase operation in which the erase operation is immediately suspended according to aspects of the disclosure;

FIGS. 11A and 11B show sequences of a segmented erase operation in which the segmented erase operation is resumed from a previous voltage segment and from a next voltage segment according to aspects of the disclosure;

FIG. 19 is a table with a plurality of offset values that may be referenced by a control circuit to elongate a segment duration of one of a plurality of voltage segments according to aspects of the disclosure;

FIG. 20 is a table with a plurality of parameter that may be referenced by the control circuit to increase the quantity of the plurality of voltage segments according to aspects of the disclosure.

DETAILED DESCRIPTION

Figure 1:
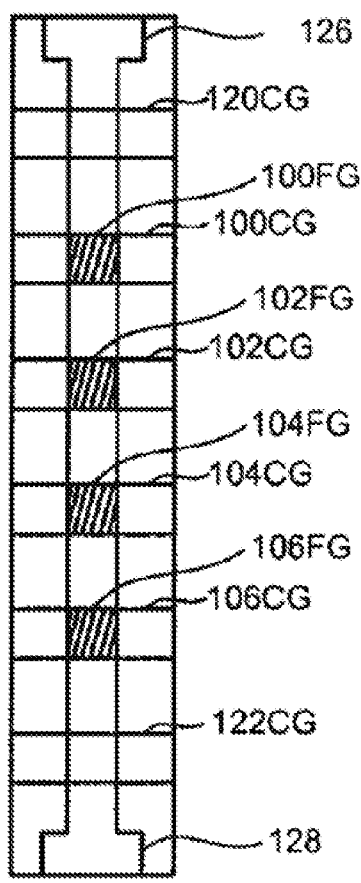
FIG. 1 is a top view of a NAND string according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Each memory cell may be associated with a data state according to write data in a program command. Based on its data state, a memory cell will either remain in the erased state or be programmed to a programmed data state. For example, in a one bit per cell memory device or apparatus, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states. In a four-bit per cell memory device, there are sixteen data states including the erased state and fifteen higher data states.

Prior to programming certain non-volatile memory devices, such as a NAND flash memory device, the memory cells are typically erased. The erase operation removes electrons from a floating gate or charge trapping layer of the memory cell, for some devices. For other devices, the erase operation removes electrons from a charge trapping layer.

In addition, memory operations of memory devices with a lower relative priority may be suspended and later resumed while higher priority operations are completed. For example, a read operation may have a higher priority over an erase operation and therefore, the erase operation is suspended and later resumed while the read operation is carried out. However, the speed of such suspended operations may present concerns depending on how the operations are suspended and resumed.

Techniques described herein can be applied to 2D NAND, 3D NAND, or memory devices other than NAND, such as, but not limited to, NOR.

Figure 2:
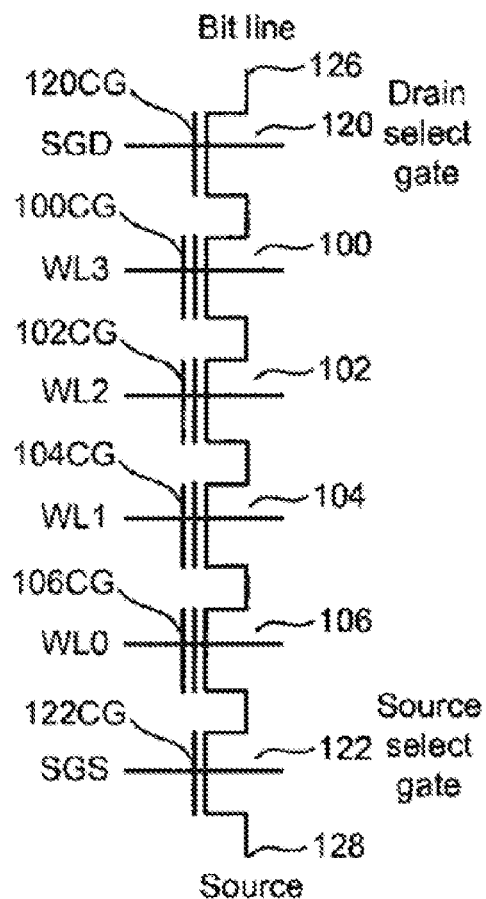
FIG. 2 is an equivalent circuit diagram of the NAND string of FIG. 1 according to aspects of the disclosure.

One example of a memory system suitable for implementing embodiments of the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate or charge trapping layer. Transistor 100 has control gate 100CG and floating gate or charge trapping layer 100FG. Transistor 102 includes control gate 102CG and floating gate or charge trapping layer 102FG. Transistor 104 includes control gate 104CG and floating gate or charge trapping layer 104FG. Transistor 106 includes a control gate 106CG and floating gate or charge trapping layer 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
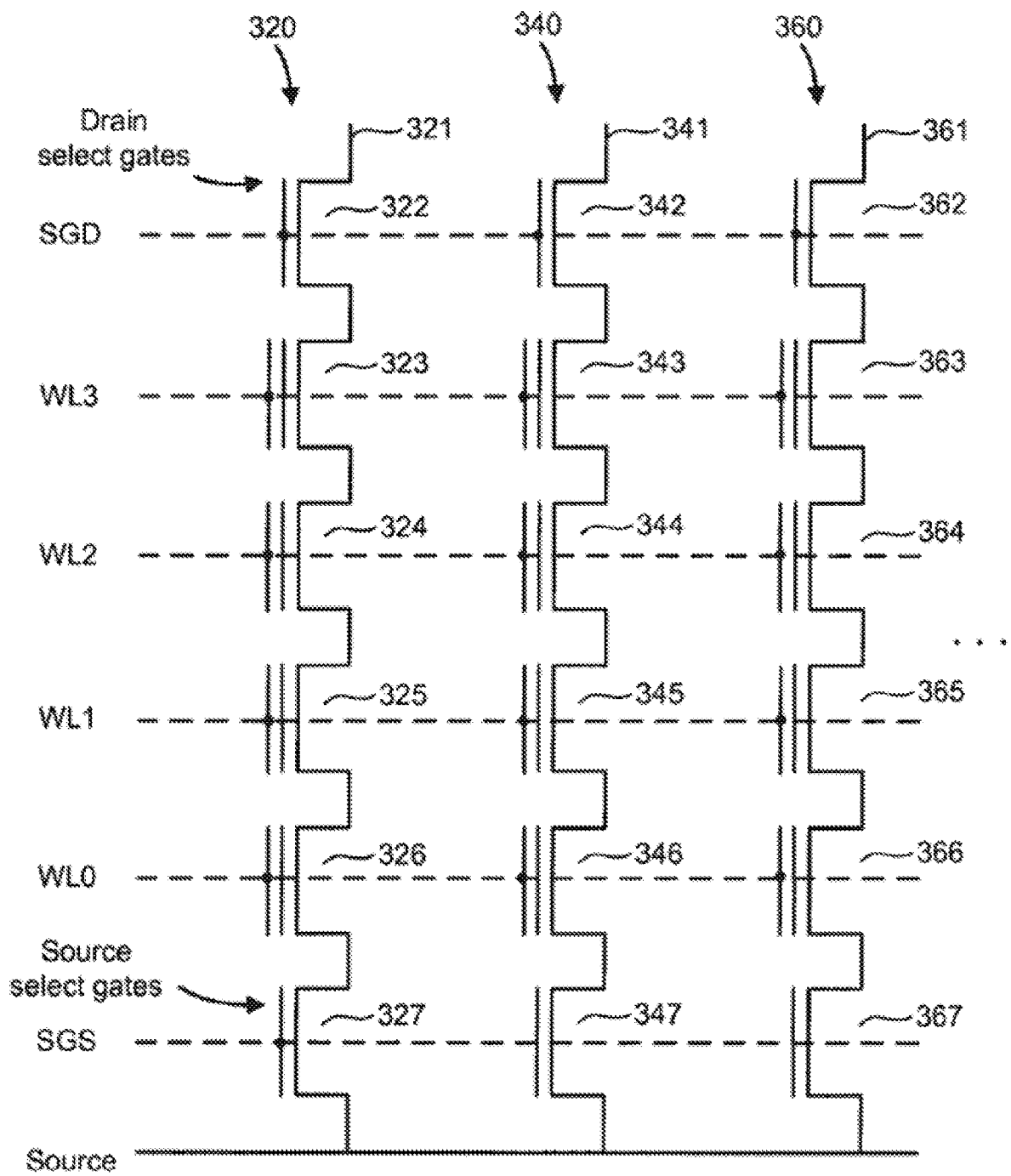
FIG. 3 is a block diagram of an array of NAND flash storage elements according to aspects of the disclosure.

FIG. 3 is a circuit diagram depicting three NAND strings. A typical architecture for a flash memory system using a NAND structure will include many NAND strings. For example, three NAND strings 320, 340 and 360 are shown in a memory array having many more NAND strings. Each of the example NAND strings includes two select gates and four storage elements. While four storage elements are illustrated for simplicity, modern NAND strings can have thirty-two, sixty-four storage elements, or some other number of storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Pat. No. 7,237,074, both of which are incorporated herein by reference in their entirety, describe various data encoding schemes for multi-state flash storage elements.

When programming a flash storage element, a program voltage is applied to the control gate of the storage element and the bit line associated with the storage element is grounded. Electrons from the channel are injected into the floating gate or charge trapping layer. When electrons accumulate in the floating gate or charge trapping layer, the floating gate or charge trapping layer becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4:
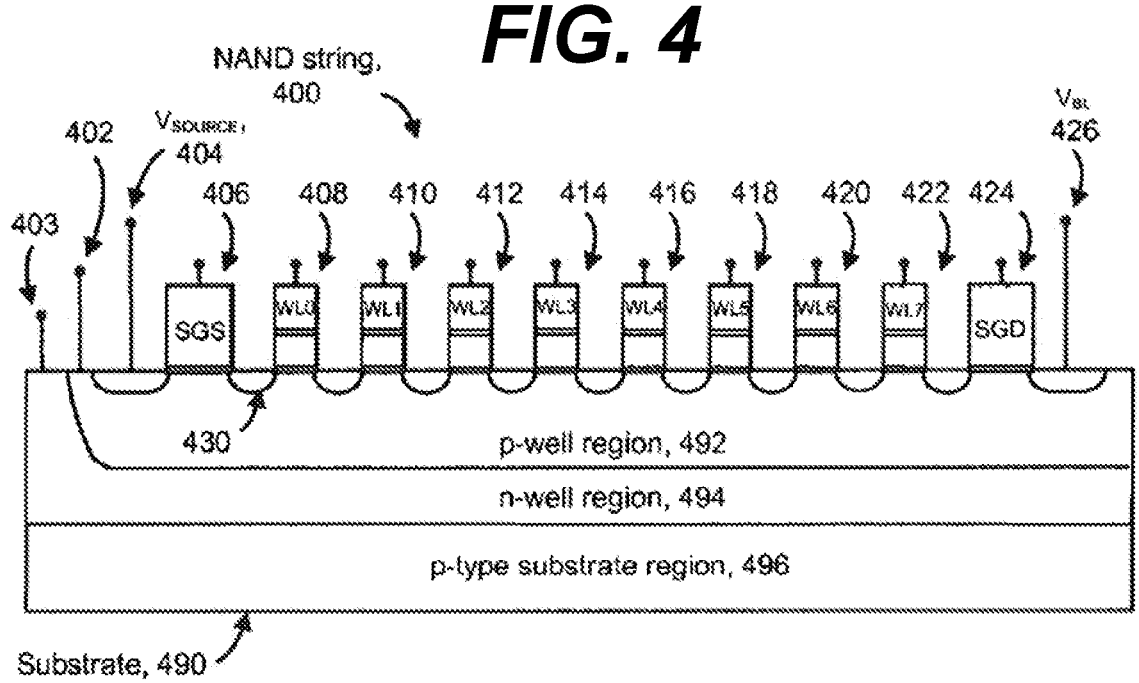
FIG. 4 depicts a cross-sectional view of a NAND string formed on a substrate according to aspects of the disclosure.

FIG. 4 depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. In one possible approach, a voltage can be applied to the p-well region 492 via a terminal 402. A voltage can also be applied to the n-well region 494 via a terminal 403.

During a read or verify operation, including an erase-verify operation, in which the condition of a storage element, such as its threshold voltage, is ascertained, $V_{CGR}$ is provided on a selected word line which is associated with a selected storage element. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, $V_{READ}$, can be applied to unselected word lines associated with NAND string 400, in one possible boosting scheme. Other boosting schemes apply $V_{READ}$ to some word lines and lower voltages to other word lines. $V_{SGS}$ and $V_{SGD}$ are applied to the select gates 406 and 424, respectively.

Figure 5:
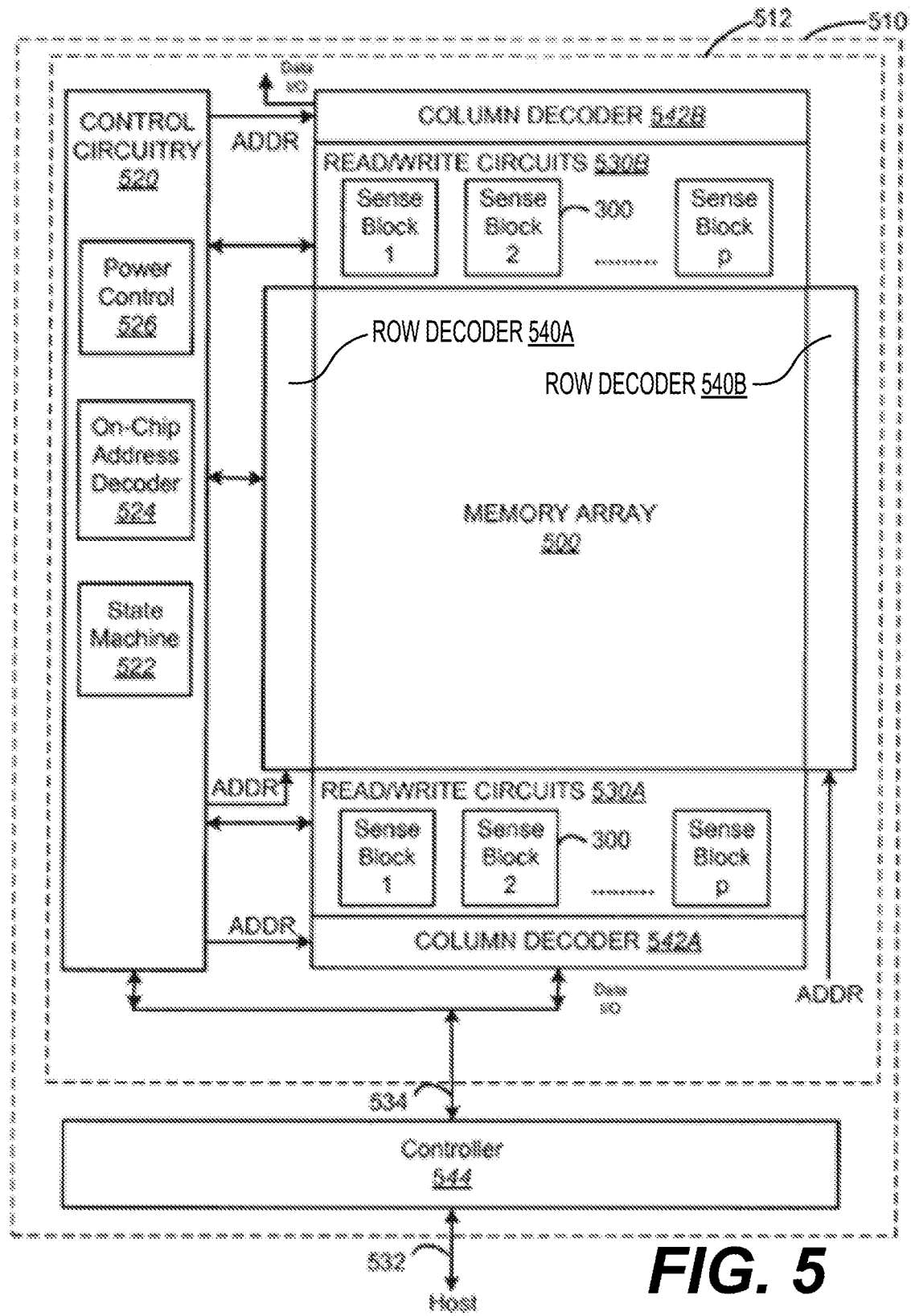
FIG. 5 illustrates a non-volatile storage device that may include one or more memory die or chips according to aspects of the disclosure.

FIG. 5 illustrates a non-volatile storage device 510 that may include one or more memory die or chips 512. Memory die 512 includes an array (two-dimensional or three dimensional) of memory cells 500, control circuitry 520, and read/write circuits 530A and 530B. In one embodiment, access to the memory array 500 by the various peripheral circuits is implemented in a symmetric fashion, on opposite sides of the array, so that the densities of access lines and circuitry on each side are reduced by half. The read/write circuits 530A and 530B include multiple sense blocks 300 which allow a page of memory cells to be read or programmed in parallel. The memory array 500 is addressable by word lines via row decoders 540A and 540B and by bit lines via column decoders 542A and 542B. In a typical embodiment, a controller 544 is included in the same memory device 510 (e.g., a removable storage card or package) as the one or more memory die 512. Commands and data are transferred between the host and controller 544 via lines 532 and between the controller and the one or more memory die 512 via lines 534. One implementation can include multiple chips 512.

Control circuitry 520 cooperates with the read/write circuits 530A and 530B to perform memory operations on the memory array 500. The control circuitry 520 includes a state machine 522, an on-chip address decoder 524 and a power control module 526. The state machine 522 provides chip-level control of memory operations. The on-chip address decoder 524 provides an address interface to convert between the address that is used by the host or a memory controller to the hardware address used by the decoders 540A, 540B, 542A, and 542B. The power control module 526 controls the power and voltages supplied to the word lines and bit lines during memory operations. In one embodiment, power control module 526 includes one or more charge pumps that can create voltages larger than the supply voltage.

In one embodiment, one or any combination of control circuitry 520, power control circuit 526, decoder circuit 524, state machine circuit 522, decoder circuit 542A, decoder circuit 542B, decoder circuit 540A, decoder circuit 540B, read/write circuits 530A, read/write circuits 530B, and/or controller 544 can be referred to as one or more managing circuits.

Figure 6A:
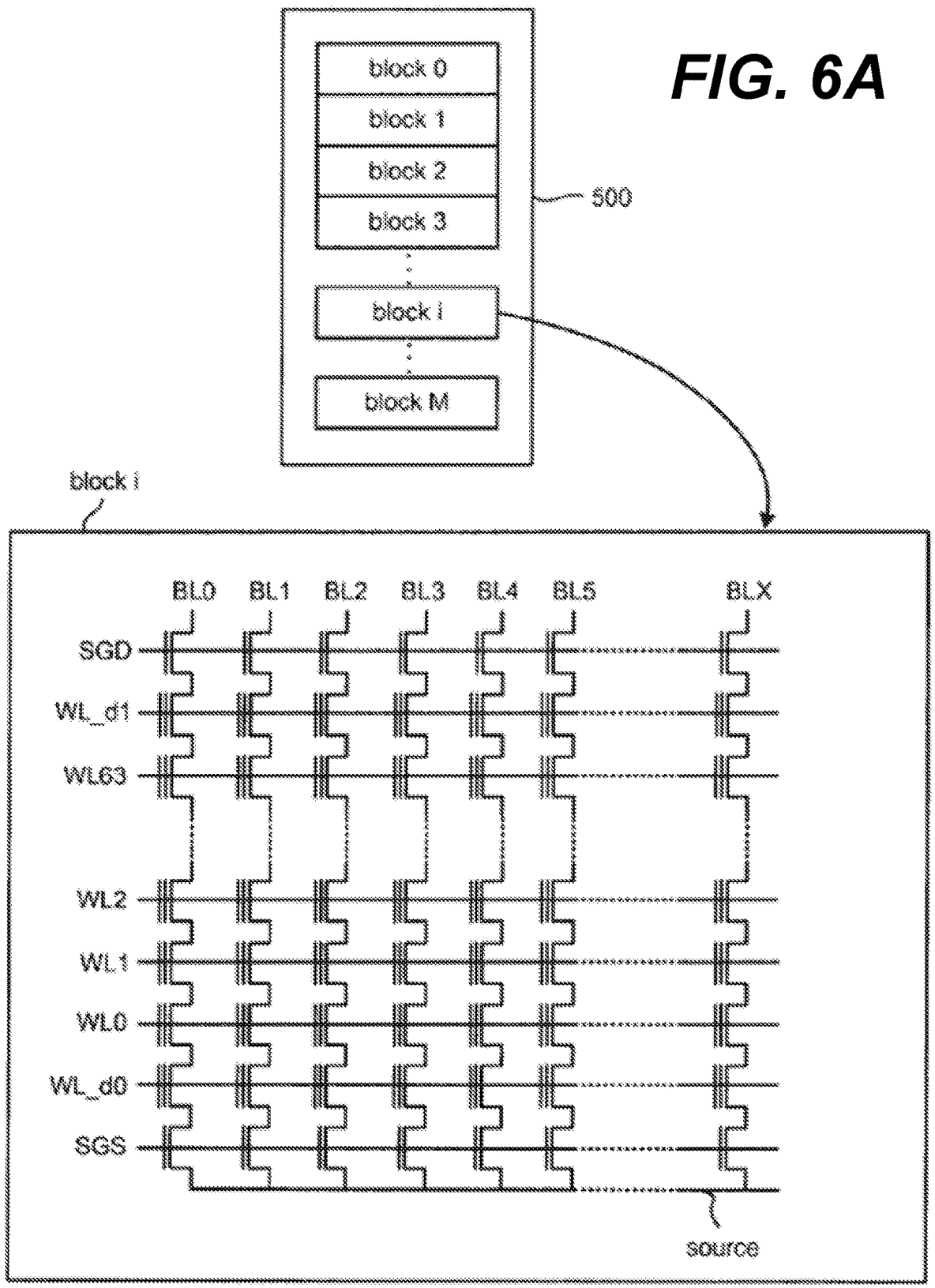
FIG. 6A depicts an exemplary structure of memory cell array according to aspects of the disclosure.

FIG. 6A depicts an exemplary structure of memory cell array 500. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 6A also shows more details of block i of memory array 500. Block i includes X+1 bit lines and X+1 NAND strings. Block i also includes 64 data word lines (WL0-WL63), two dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6B:
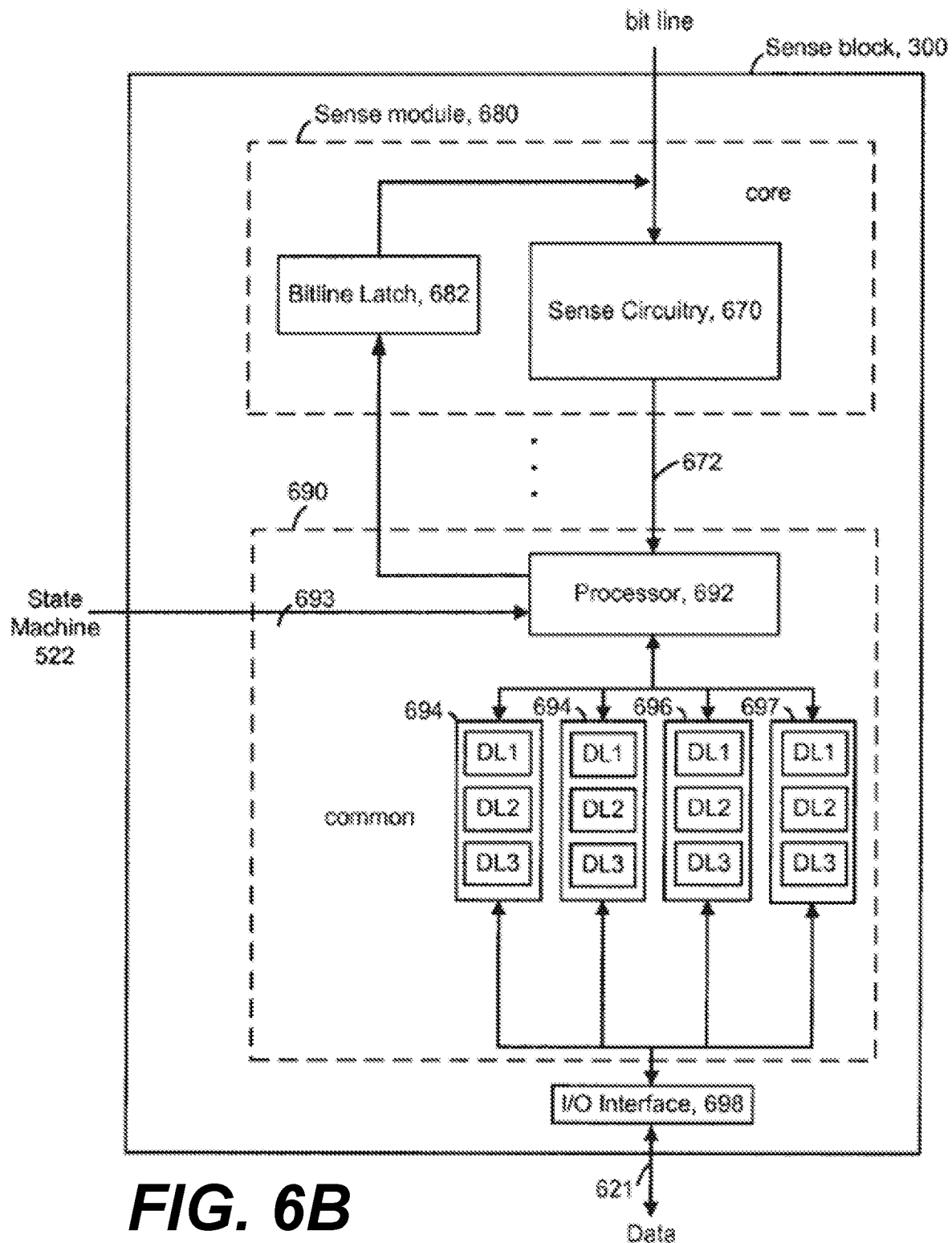
FIG. 6B is a block diagram depicting one embodiment of a sense block according to aspects of the disclosure.

FIG. 6B is a block diagram depicting one embodiment of a sense block 300. An individual sense block 300 is partitioned into a core portion, referred to as a sense module 680, and a common portion 690. In one embodiment, there is a separate sense module 680 for each bit line and one common portion 690 for a set of multiple sense modules 680. In one example, a sense block 300 will include one common portion 690 and eight sense modules 680. Each of the sense modules in a group will communicate with the associated common portion via a data bus 672.

Sense module 680 comprises sense circuitry 670 that determines whether a conduction current in a connected bit line is above or below a predetermined threshold level. Sense module 680 also includes a bit line latch 682 that is used to set a voltage condition on the connected bit line. For example, a predetermined state latched in bit line latch 682 will result in the connected bit line being pulled to a state designating program inhibit (e.g., 1.5-3 V). As an example, a flag=0 can inhibit programming, while flag=1 does not inhibit programming.

Common portion 690 comprises a processor 692, three example sets of data latches 694 and an I/O Interface 698 coupled between the sets of data latches 694 and data bus 621. One set of data latches can be provided for each sense module, and three data latches identified by DL1, DL2, and DL3 may be provided for each set. The use of the data latches is further discussed below.

Processor 692 performs computations. For example, one of its functions is to determine the data stored in the sensed storage element and store the determined data in the set of data latches. At least some of the data latches in a set of data latches (e.g., 694) are used to store data bits determined by processor 692 during a read operation. At least some of the data latches in a set of data latches are also used to store data bits imported from the data bus 621 during a program operation. The imported data bits represent write data meant to be programmed into the memory. I/O interface 698 provides an interface between data latches 694-697 and the data bus 621.

In one embodiment, data is stored in the DL1 and DL2 latches at the beginning of the program operation. For example, lower page data may be stored in DL1 and upper page data may be stored in DL2. In one embodiment, lower page data that is read from memory cells during an IDL is stored in the DL1 latches. DL3 may be used to store verify status, such as lockout status during programming. For example, when a memory cell's Vt has been verified a reaching its target level, the DL3 latch can be set to indicate this such that further programming of the memory cell may be inhibited. Note this describes programming two bits per memory cell. In one embodiment, during a read operation, the DL1 and DL2 latches are used to store the two bits that are read from the memory cell. Note that there may be more than two bits per memory cell. There can be one additional latch for each additional bit to be stored per memory cell.

During reading or other sensing, the state machine 622 controls the supply of different control gate voltages to the addressed storage element. As it steps through the various control gate voltages corresponding to the various memory states supported by the memory, the sense module 680 may trip at one of these voltages and an output will be provided from sense module 680 to processor 692 via bus 672. At that point, processor 692 determines the resultant memory state by consideration of the tripping event(s) of the sense module and the information about the applied control gate voltage from the state machine via input lines 693. It then computes a binary encoding for the memory state and stores the resultant data bits into data latches (e.g., 694). In another embodiment of the core portion, bit line latch 682 serves both as a latch for latching the output of the sense module 680 and as a bit line latch as described above.

Some implementations can include multiple processors 692. In one embodiment, each processor 692 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 692 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 694-697 from the data bus 621. The program operation, under the control of the state machine, comprises a series of programming voltage pulses applied to the control gates of the addressed storage elements. Each program pulse is followed by a read back (verify) to determine if the storage element has been programmed to the desired memory state. Processor 692 monitors the read back memory state relative to the desired memory state. When the two are in agreement, the processor 692 sets the bit line latch 682 so as to cause the bit line to be pulled to a state designating program inhibit. This inhibits the storage element coupled to the bit line from further programming even if program pulses appear on its control gate. In other embodiments, the processor initially loads the bit line latch 682 and the sense circuitry sets it to an inhibit value during the verify process.

Each set of data latch stacks 694-697 contains a stack of data latches corresponding to the sense module 680, in one embodiment. In one embodiment, there are three data latches per sense module 680. All the DL1 and DL2 data latches corresponding to the read/write block of m storage elements can be linked together to form a block shift register so that a block of data can be input or output by serial transfer.

In one embodiment, one purpose of the DL1 and DL2 latches is to store data that is to be programmed into a storage element. For example, the storage elements may store two bits per storage element. In one embodiment, lower page data is initially stored into the DL1 latches and upper page data is initially stored into the DL2 latches.

In one embodiment, the storage elements store three bits per storage element. In this case, there may be an additional data latch (not depicted in FIG. 6B) for initially storing the third bit of data that is to be programmed into a storage element. In one embodiment, the storage elements four bits per storage element, in which there may be two additional data latches (not depicted in FIG. 6B) for initially storing the third and fourth bits of data that is to be programmed into a storage element. The storage elements could store more than four bits per storage element, in which case there may be one data latch for each bit.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. patent application Pub. No. 2005/0169082; (4) U.S. Pat. No. 7,196,928, "Compensating for Coupling During Read Operations of Non-Volatile Memory," and (5) U.S. patent application Pub. No. 2006/0158947, "Reference Sense Amplifier For Non-Volatile Memory," published on Jul. 20, 2006. All five of the immediately above-listed patent documents are incorporated herein by reference in their entirety.

At the end of a successful program process, the threshold voltages of the memory cells should be within one or more distributions of threshold voltages for programmed memory cells or within a distribution of threshold voltages for erased memory cells.

Figure 7:
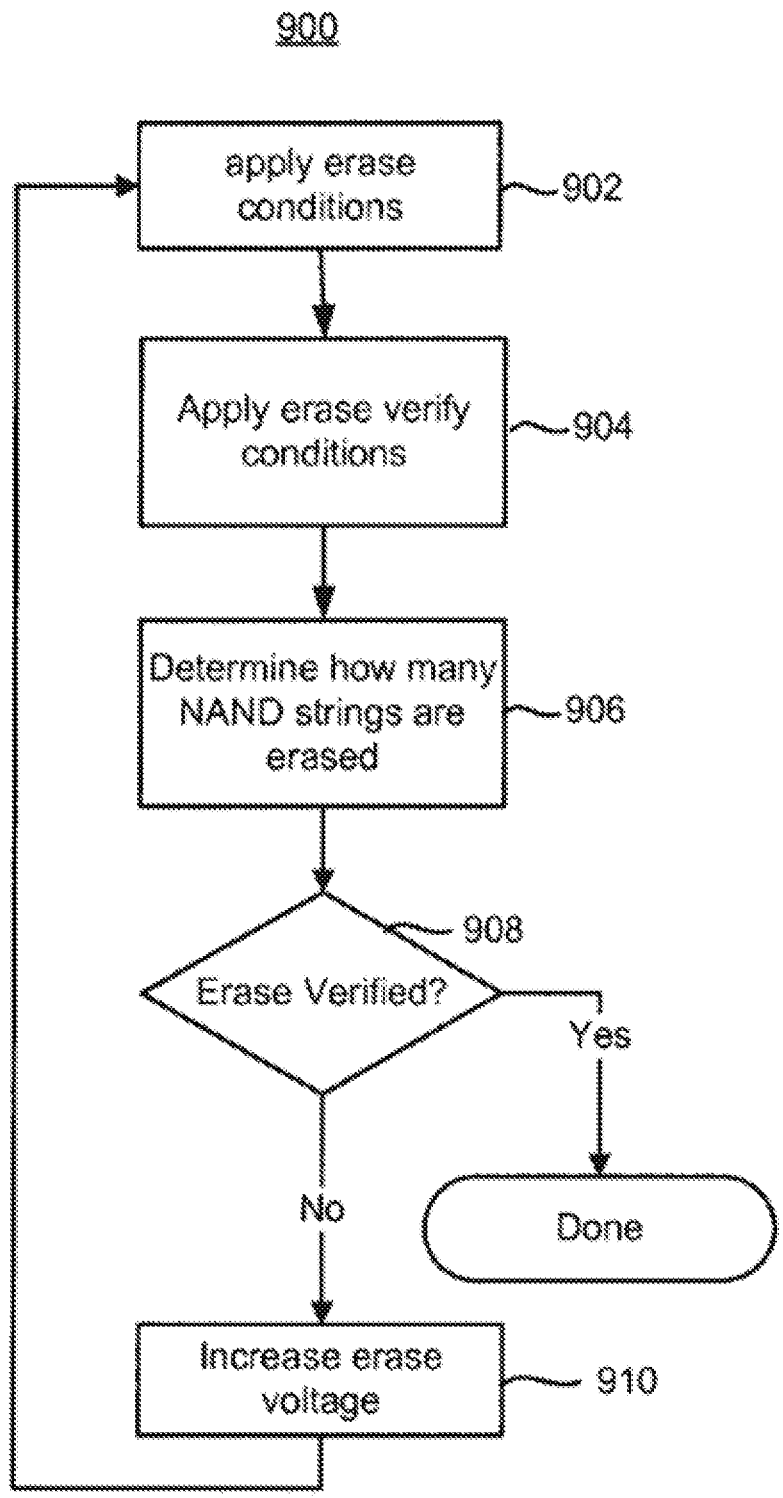
FIG. 7 is a flow chart describing a conventional process for erasing memory cells according to aspects of the disclosure.

FIG. 7 is a flow chart describing a conventional process 900 for erasing memory cells. In step 902, erase conditions are applied to the memory cells. In one embodiment, the erase is achieved by raising the p-well to an erase voltage for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates or charge trapping layers are emitted to the substrate side, typically by Fowler-Nordheim tunneling mechanism. As electrons are transferred from the floating gate or charge trapping layer to the p-well region, the $V_{TH}$ of a selected cell is lowered. Erasing can be performed on the entire memory array, on individual blocks, or another unit of cells.

In step 904, a set of erase verify conditions are applied to the memory cells. The target $V_{TH}$ could be positive or negative. In some embodiments, sensing for a positive $V_{TH}$ involves applying a positive reference voltage to word lines and determining whether the NAND string conducts a current in response.

In one implementation, source follower sensing is employed for sensing for a negative $V_{TH}$. Step 904 may include discharging bit lines to ground, which may be achieved by turning on the drain side select gate (SGD). Then, a higher than zero voltage (e.g., 2.2V) is applied to the common source line and a certain voltage (e.g., 0V) is applied to the word lines. Charge builds up on the bit line of a given NAND string until the body effect turns off at least one memory cell in the NAND string. However, other sensing techniques can be used.

In step 906, each of the NAND strings is sensed to determine whether all of the memory cells on the NAND string were sufficiently erased. Step 906 is performed after waiting for a predetermined period of time for the charge to build up on the bit line, in one embodiment. In one implementation, the voltage on a given bit line is compared to a reference value to determine whether any of the memory cells on the corresponding NAND string have a $V_{TH}$ that is above the target value. The target value could be a negative value. In some implementations, the memory cells are erased to as much as -3V.

In one embodiment, if it is detected that the $V_{TH}$ of each memory cell on a NAND string has reached the target level, then the data stored in the corresponding data latch is changed to a logic "1." If it is detected that the NAND string has at least one memory cell with a $V_{TH}$ that has not reached the appropriate target level, the data stored in the corresponding data latch is not changed.

In step 908, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase passed, then the process concludes.

If, at step 908, it is determined that erase verification failed, then the erase voltage is increased in step 910. The erase voltage can be increased by any desired amount such as 0.2 V, 0.5 V, 1.0 V, etc. The new erase voltage is applied in step 902.

Figure 8A:
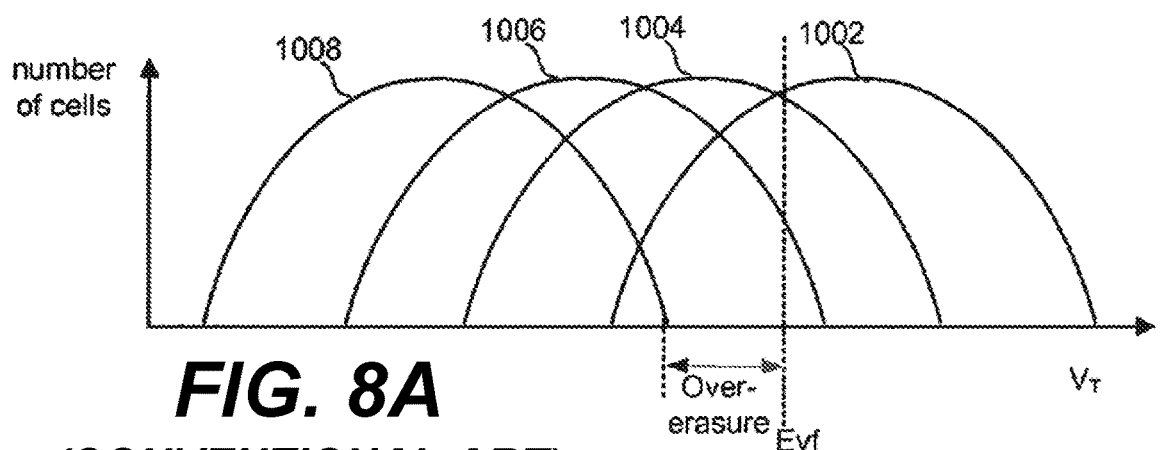
FIGS. 8A-8C depict example threshold distributions during a conventional erase process according to aspects of the disclosure.
Figure 8B:
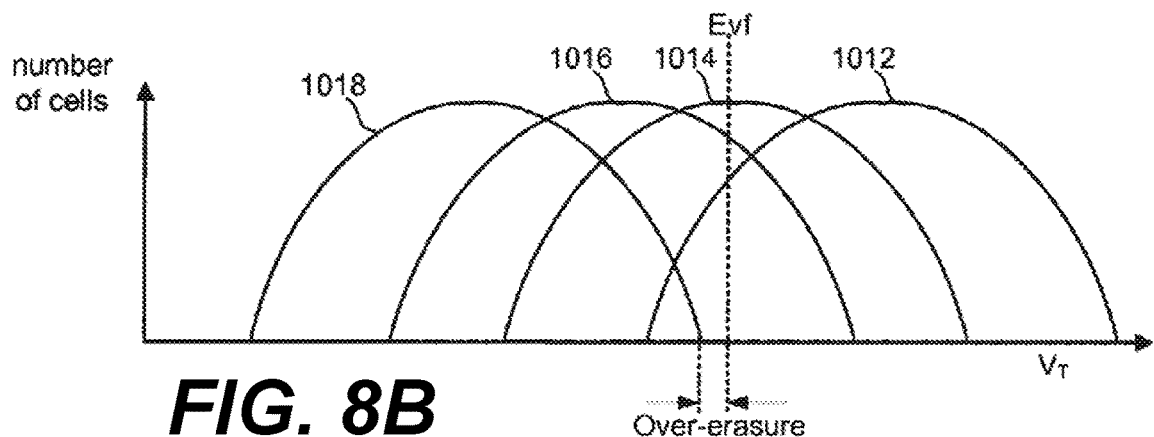
Figure 8C:
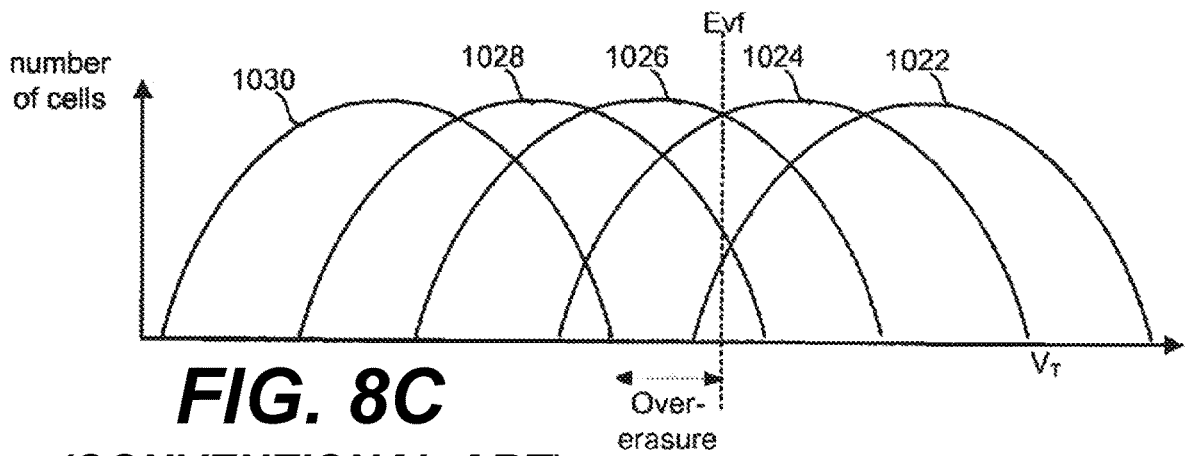

FIGS. 8A-8C depict example threshold distributions during a conventional erase process, such as the one of FIG. 7. FIG. 8A depicts example threshold distributions 1002-1008 at four different stages of an erase procedure. That is, each distribution corresponds to application of one additional erase pulse. Distribution 1002 represents the earliest in time of the four distributions, with 1004, 1006, and 1008 following in that order. Referring back to FIG. 7, these may correspond to the $V_{TH}$ distribution for each loop of process 900. As noted at step 910, the erase voltage may be increased with each iteration. The memory cells are being verified for the threshold voltage level "Evf" in FIG. 8A. This refers to a final $V_{TH}$ level.

The application of each additional erase pulse may move the distribution by a significant amount. As can be seen, a significant number of memory cells have not yet been erased for distributions 1002-1006. In particular, distribution 1006 shows that there are still a significant number of memory cells having a threshold voltage greater than Evf. With the application of one additional erase pulse, the memory cells are moved to distribution 1008. The difference between the upper tail of distribution 1008 and Evf is referred to as "over-erasure." This is because the memory cells did not need to be erased quite so deeply. That is, distribution 1008 could be farther to the right (higher $V_{TH}$) and still pass erase. Note that it is not required that every memory cell has its threshold voltage below Evf for erase to pass. There may be some "outliers" (e.g., memory cells with $V_{TH}$ above Evf) that are not depicted in FIG. 8A. Also, as noted in the discussion of FIG. 7, one technique for verifying the memory cells is to verify on a NAND string basis, as opposed to testing each storage element separately.

Note that for many types of memory cells and erase techniques the distribution of threshold voltages that results from, for example, the first erase pulse changes with use of the memory array. For example, early in the life of the memory, application of a 10V erase pulse may result in a distribution centered at a threshold voltage of 0V. However, after further program/erase cycles the same 10V erase pulse may result in a distribution centered at a threshold voltage of 1V. Thus, a series of pulses that previously could sufficiently erase the memory may later not be sufficient, and more pulses or pulses with higher magnitudes are now required.

FIG. 8B depicts a further example of threshold distributions 1012-1018 at four different stages of an erase procedure. FIG. 8B is for an example after the memory cells have been through additional erase/program cycles relative to the example of FIG. 8A. This example differs from the one of FIG. 8A in that after the first erase pulse is applied, the memory cells are not quite as deeply erased. That is, for distribution 1012 fewer memory cells have their $V_{TH}$ below Evf, compared to distribution 1002. Further note that after the fourth erase pulse, the amount of over-erasure is actually less than for the example of FIG. 8A.

FIG. 8C depicts a further example of threshold distributions 1022-1030 after still more erase/program cycles. In this example, it takes five erase pulses to erase the memory cells. The fifth erase pulse results in a significant over-erasure. Note that the amount of over-erasure can change as a function of the number of erase cycles. Also, the amount of over-erasure can actually oscillate between significant over-erasure, low over erasure, significant over-erasure, etc.

Figure 9A:
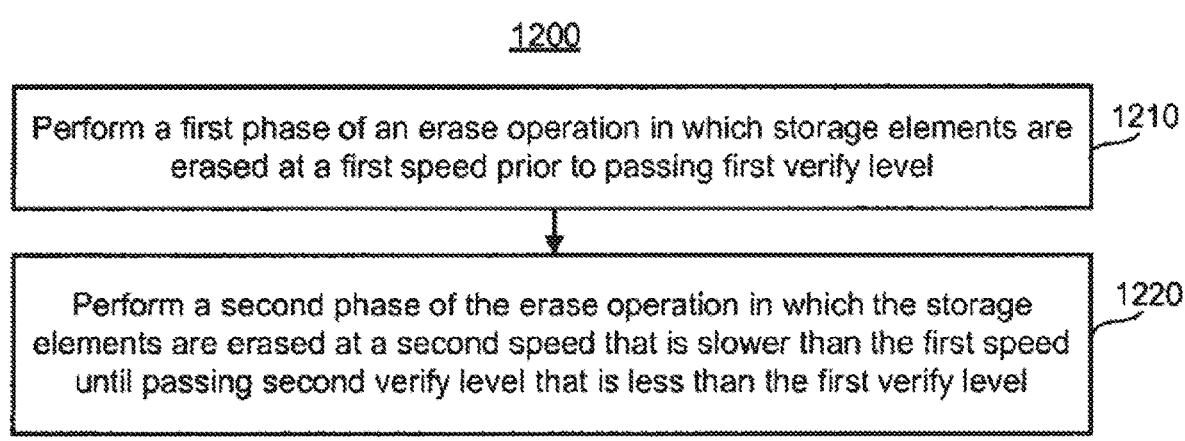
FIG. 9A is a flowchart of one embodiment of a process of erasing non-volatile storage according to aspects of the disclosure.
Figure 9B:
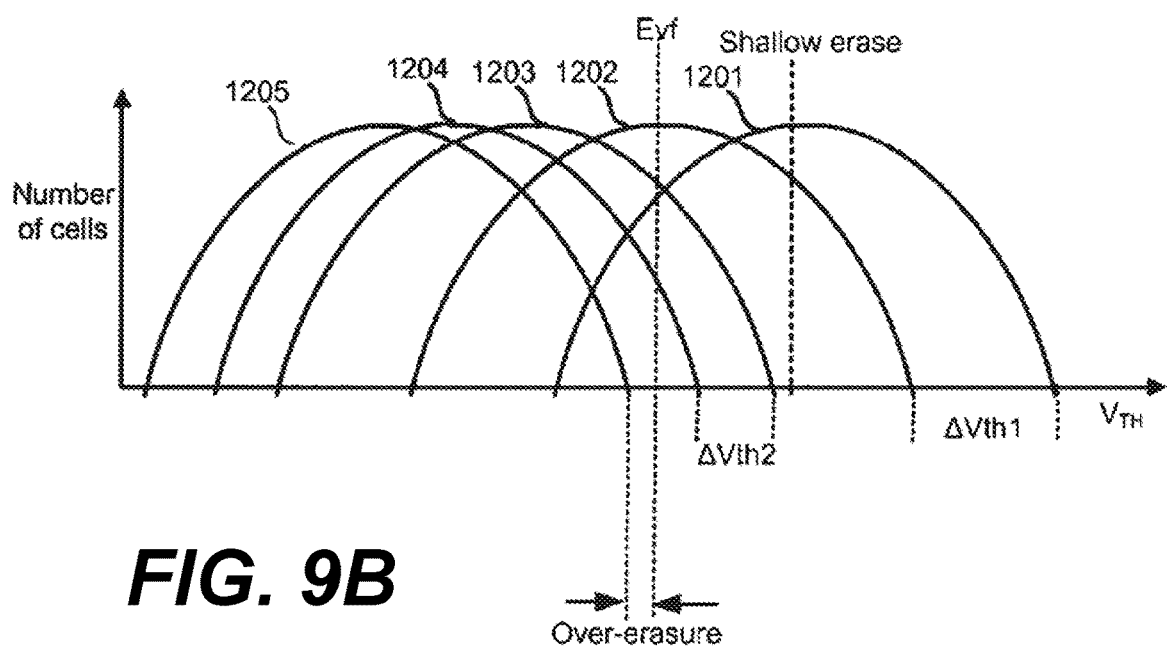
FIG. 9B shows some example erase distributions to help illustrate the process of FIG. 9A according to aspects of the disclosure.

FIG. 9A is a flowchart of one embodiment of a process 1200 of erasing non-volatile storage. This process 1200 involves a first phase in which memory cells are erased at a faster speed and a second phase in which memory cells are erased at a slower speed. This process increases the endurance of the memory cells. FIG. 9B shows some example erase distributions to help illustrate this process.

In step 1210, a first phase of the erase operation is performed. In the first phase the memory cells are erased at a first speed, which is faster than they will be erased during the second phase. During phase 1, the verify level is higher than the final target level. Using this higher verify level may be referred to as a "shallow erase." Referring to FIG. 9B, the shallow erase level is depicted (labeled "shallow erase"), along with the final target level ("Evf"). During phase 1, the memory cells are verified for the shallow erase level. In one embodiment, NAND strings are verified.

In this example, it takes three erase pulses prior to the memory cells passing the verify at the shallow erase level. After the first erase pulse, the memory cells have $V_{TH}$ distribution 1201. After the second erase pulse, the memory cells have $V_{TH}$ distribution 1202. After the third erase pulse, the memory cells have $V_{TH}$ distribution 1203.

In step 1220, a second phase of the erase operation is performed. In the second phase the memory cells are erased at a second speed, which is slower than they were erased during the first phase. During phase 2, the verify level is the final target level in this example. However, there could be more than two phases.

In the example of FIG. 9B, it takes two additional erase pulses for the memory cells to pass the verify at the final level. After the first erase pulse of the second phase, the memory cells have distribution 1204. After the second erase pulse of the second phase, the memory cells have distribution 1205. Again, the rate at which the memory cells are being erased is reflected by the amount by which the $V_{TH}$ distributions shift. Slowing the speed of erasure during phase 2 helps to prevent over-erasure, which in turn helps to increase endurance. In effect, the slower speed during phase 2 may result in additional erase pulses being used. However, it allows for more precise movement of the erase $V_{TH}$ distribution. That is, it allows the erase $V_{TH}$ distribution to be moved by smaller amounts with each erase pulse.

The rate at which the memory cells are being erased is reflected by the amount by which the $V_{TH}$ distributions shift. The memory cells are erased at a faster rate during phase 1 than during phase 2. The erase pulse that pushed the memory cells from distribution 1201 to 1202, erased the memory cells at a speed of $\Delta V_{TH1}$. The erase pulse that pushed the memory cells from distribution 1203 to 1204, erased the memory cells at a speed of $\Delta V_{TH2}$. $\Delta V_{TH2}$ is less than $\Delta V_{TH1}$; therefore, this is a slower erase, as defined herein. It is not required that every erase pulse in phase 1 be the exact same speed. That is, it is not required that the movement be exactly $\Delta V_{TH1}$ for every pulse during phase 1. Likewise, it is not required that every erase pulse in phase 2 be the exact same speed. That is, it is not required that the movement be exactly $\Delta V_{TH2}$ for every pulse during phase 2. In this example, the change in $V_{TH}$ distribution was measured at the upper tail. However, it could be measured at some other point, such as the median $V_{TH}$ of the group under erase.

The process of FIG. 9A can be used for 2D NAND or 3D NAND. In one 2D NAND embodiment, the erase is achieved by raising the p-well to an erase voltage for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates or charge trapping layers are emitted to the substrate side, typically by Fowler-Nordheim tunneling mechanism. As electrons are transferred from the floating gate or charge trapping layer to the p-well region, the $V_{TH}$ of a selected cell is lowered. Erasing can be performed on the entire memory array, on individual blocks, or another unit of cells.

Erase for 3D NAND is typically different than 2D NAND. In contrast, the NAND strings in a 3D stacked non-volatile memory device such as BiCS do not necessarily reside in a substrate. One approach to erasing is to generate gate induced drain leakage (GIDL) current to charge up the channel, raise the channel potential to an erase voltage, and maintain this channel potential during erase. Further details for erasing 3D NAND are described in: (1) U.S. Patent Publication 2013/0279257, entitled "Erase Operation for 3D Non-Volatile Memory with Controllable Gate Induced Drain Leakage Current," by Costa et al.; and (2) U.S. Patent Publication 2013/0163336, entitled "Erase Operation with Controlled Select Gate Voltage for 3D Non-Volatile Memory," by Li et al.; both of which are hereby incorporated by reference.

Various techniques can be used to alter the speed of erase between the first and second phases. One technique is to use a smaller step size of the increase in magnitude of the erase voltage with each program loop. For example, a smaller step size is used during the second phase than the first phase. Another technique is to alter the time duration of the erase pulse. For example, the first phase can have large increases in time duration, and the second phase can have small increases in time duration. As another example, a shorter duration erase pulse is used during the second phase than the first phase. Still another technique is to change the number of erase pulses used between verify operations. For example, the first phase can have a large increase in the number of pulses between verifies, and the second phase can have a small increase in the number of pulses between verifies. As another example, fewer erase pulses are used between verifies during the second phase than the first phase. Any combination of these three techniques could be used to create a slower speed of erase in the second phase.

Note that there may be more than two phases. Each phase can employ a different erase verify level. Also, each phase can use a different speed. In one embodiment, the erase speed is slowed with each progressive phase.

As previously discussed, some memory operations may have a higher priority over an erase operation and therefore, the erase operation is suspended and later resumed while the read operation is carried out. There are several suspend-resume algorithms for erase that may be used. Nevertheless, the speed of such suspended operations may present concerns depending on how the operations are suspended and resumed.

FIG. 10 shows a sequence of an erase operation in which the erase operation is immediately suspended. The erase operation suspends immediately upon a request, no matter which stage the erase operation is on and the erase operation is resumed from the very beginning of the suspended erase pulses. Such operation helps read latency, however, at the cost of some device reliability risks. The first concern is a drain side select gate (SGD) disturb especially at low temperature. This disturb is caused by electron injection during erase voltage VERA ramp up especially at low temperature. The memory device can very frequently receive suspend request and there is a chance that an erase operation takes many trials to finish eventually, which means numerous erase voltage VERA ramp-ups. So, the SGD disturb issue does need to be considered.

FIGS. 11A and 11B show sequences of a segmented erase operation in which the segmented erase operation is resumed from a previous voltage segment and from a next voltage segment. Instead of a single continuous erase pulse for the entire duration of the pulse (VERA duration), the pulse is broken into a number of voltage segments in such a segmented erase operation. As long as the total erase voltage VERA time is the same, the erase speed of such a segmented erase operation will be the same. In FIG. 11A, a sequence is shown in which the segmented erase operation is resumed from a previous voltage segment. Upon receiving a suspend request, the memory device or apparatus suspends the segmented erase operation after that particular on-going segment time is finished. After resuming, the erase operation will resume from that segment where it was suspended. So, the segmented erase is suspended after voltage segment n is finished and resumed from voltage segment n. Such operation can be a good tradeoff between latency and device reliability. Nevertheless, in the sequence shown in FIG. 11A, an extreme case exists where the memory device experiences suspend-resume always on voltage segment n. By the time the memory device carries out the erase verify in such a case, it may be too late and over erasure has already occurred. In FIG. 11B, a sequence is shown in which the segmented erase operation is resumed from a next voltage segment. As shown, the segmented erase operation is suspended after segment n is finished and resumed from voltage segment n+1. Such segmented erase operation may suffer some overhead ramp-up timing issue for each erase voltage VERA segment. The erase voltage VERA ramp-up time needs to be long enough to ensure that the erase voltage segment time is not consumed. This particular case (i.e., segmented erase and resume from next segment) is discussed in more detail below.

Figure 12A:
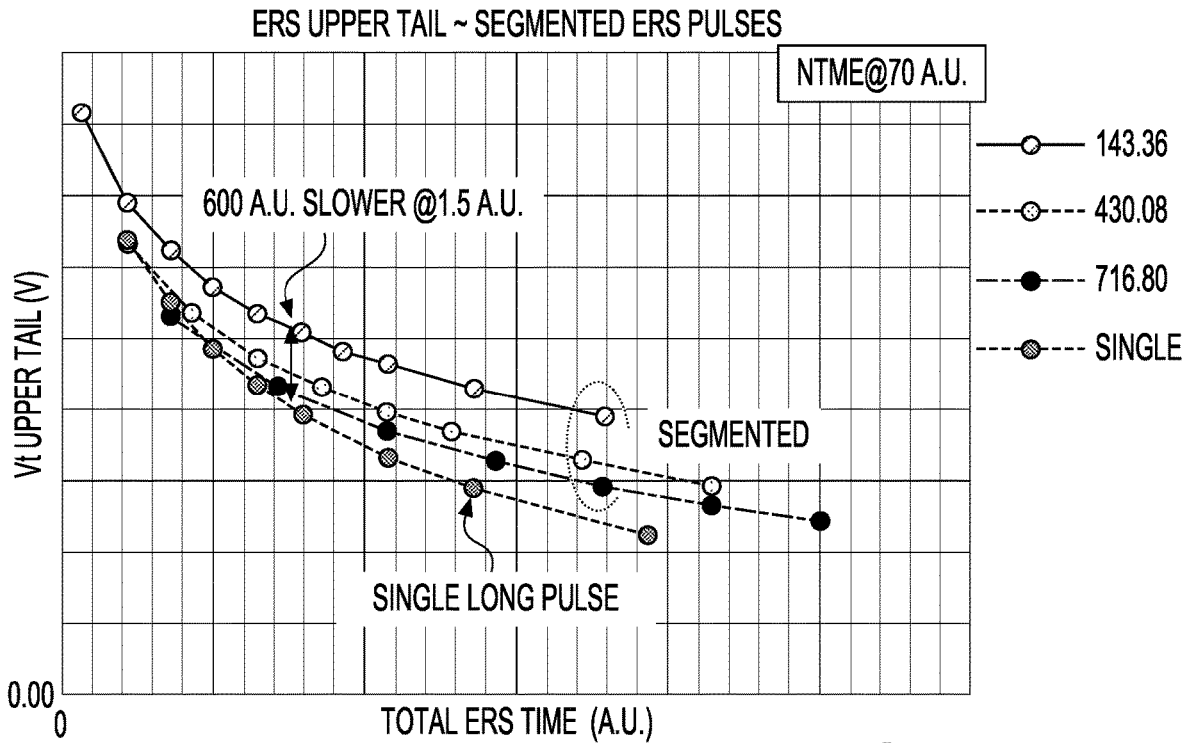
FIGS. 12A and 12B show a comparison of many short erase pulses or a plurality of voltage segments of an erase signal to a single long erase pulse according to aspects of the disclosure.
Figure 12B:
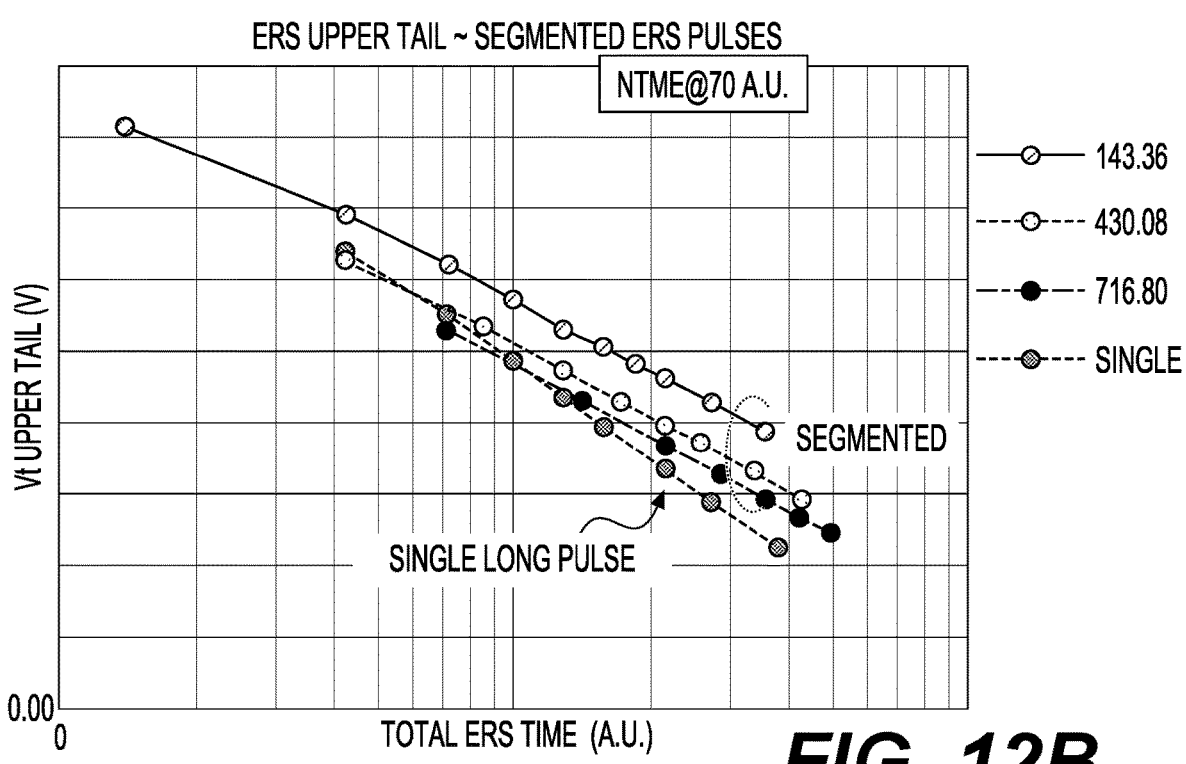

FIGS. 12A and 12B show a comparison of many short erase pulses or a plurality of voltage segments of an erase signal to a single long erase pulse. In more detail, FIG. 12A is a plot of a voltage of an upper tail for memory cells that have experienced a segmented erase operation with different total erase time periods (NTME or effective VERA time) versus time with a linear scale as compared to a single long pulse. FIG. 12B a plot of a voltage of an upper tail for memory cells that have experienced the segmented erase operation with different total erase time periods (NTME) versus time with a logarithmic scale as compared to the single long pulse. It is clear that as the duration of each of the plurality of voltage segments (i.e., segment size) becomes shorter, an erase speed downgrades further even though the total erase time period (NTME) is the same. This implies that a true channel potential takes an inflexible ramping time to become stable. This ramping time is more inflexible for shorter durations each of the plurality of voltage segments. Other mechanisms may also cause the segmented erase operation to differ from a regular (single long pulse) erase operation.

Figure 13A:
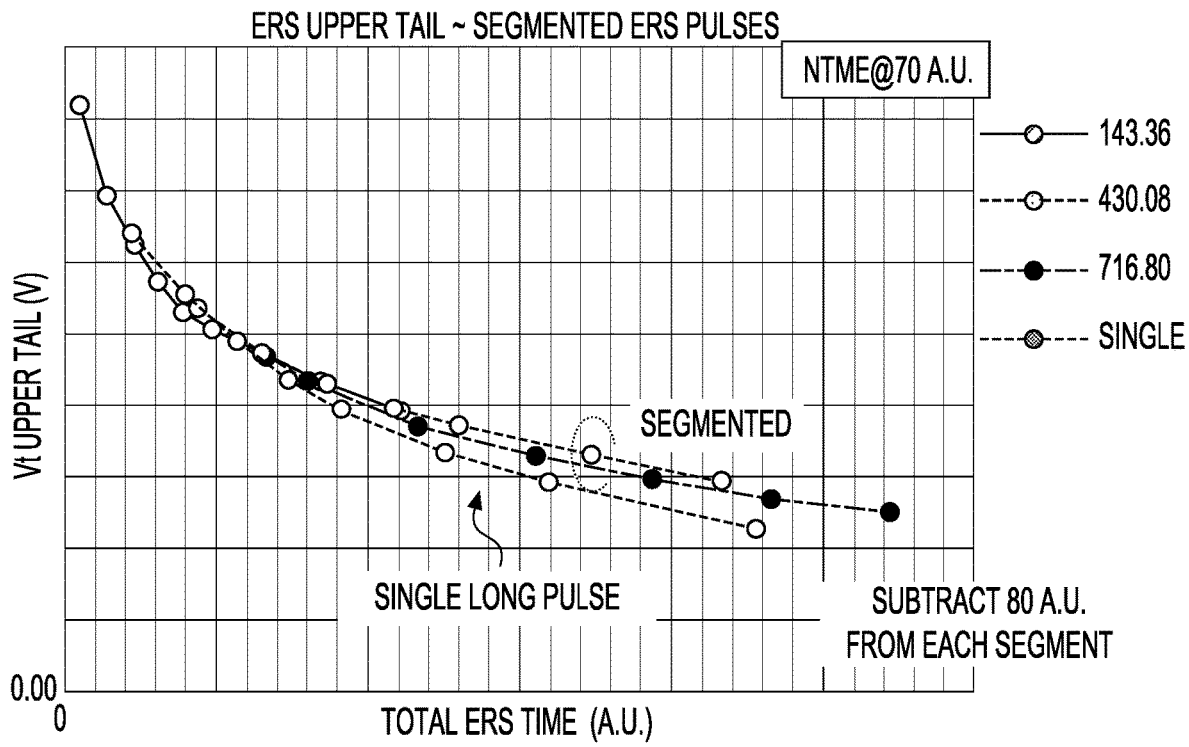
FIGS. 13A and 13B show another comparison of many short erase pulses or the plurality of voltage segments of the erase signal to the single long erase pulse according to aspects of the disclosure.
Figure 13B:
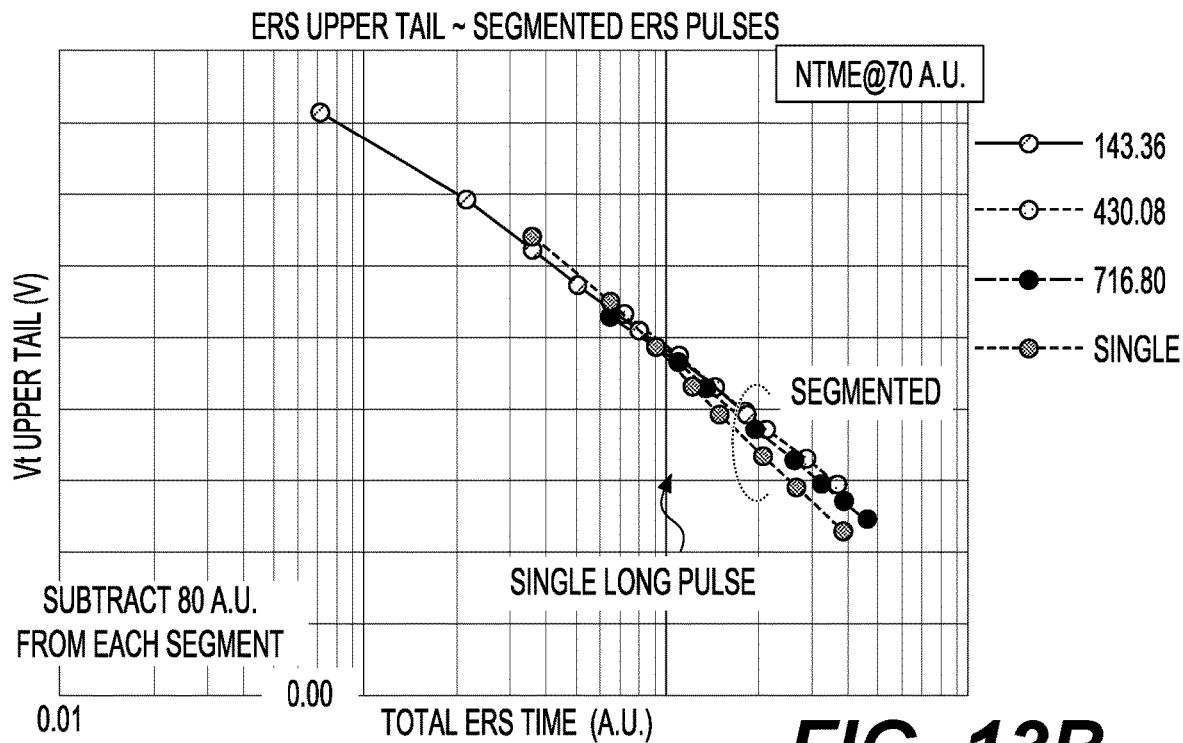

FIGS. 13A and 13B show another comparison of many short erase pulses or the plurality of voltage segments of the erase signal to the single long erase pulse. The data shown in FIG. 13A-13B is similar to in FIGS. 12A-12B; however, for each of the plurality of voltage segments or erase segments, a fixed timing of 70 a.u. was subtracted from its duration. After this shortening, it is believed the total erase time period (NTME) will be the same as a single erase pulse erase time period with the erase signal being a single continuous pulse. Nonetheless, some difference (~150 a.u.) of the upper tail is observed between the segmented erase and the single long pulse erase operation.

Figure 14A:
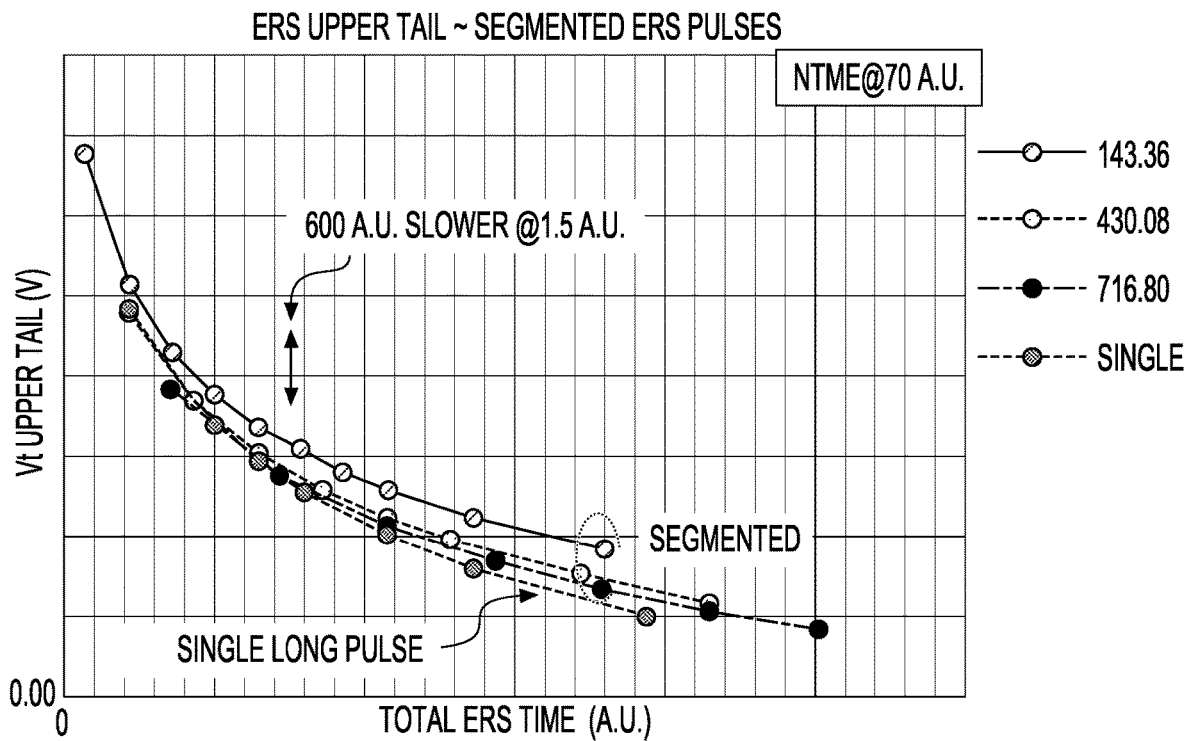
FIGS. 14A and 14B show yet another comparison of many short erase pulses or the plurality of voltage segments of the erase signal to the single long erase pulse according to aspects of the disclosure.
Figure 14B:
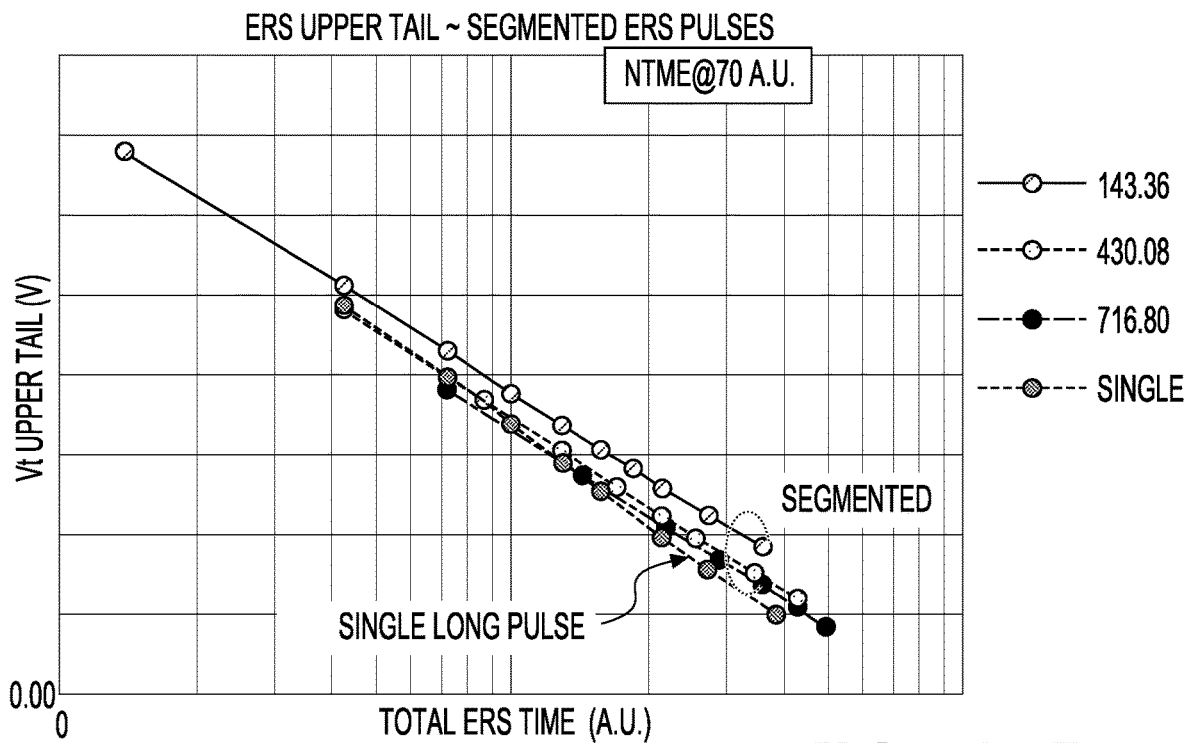

FIGS. 14A and 14B show yet another comparison of many short erase pulses or the plurality of voltage segments of the erase signal to the single long erase pulse. More specifically, FIG. 14A is a plot of the voltage of the upper tail for memory cells that have experienced the segmented erase operation with different total erase time periods (NTME) versus time with the linear scale as compared to a single long pulse. FIG. 14B a plot of the voltage of the upper tail for memory cells that have experienced the segmented erase operation with different total erase time periods (NTME) versus time with the logarithmic scale as compared to the single long pulse.

Figure 15A:
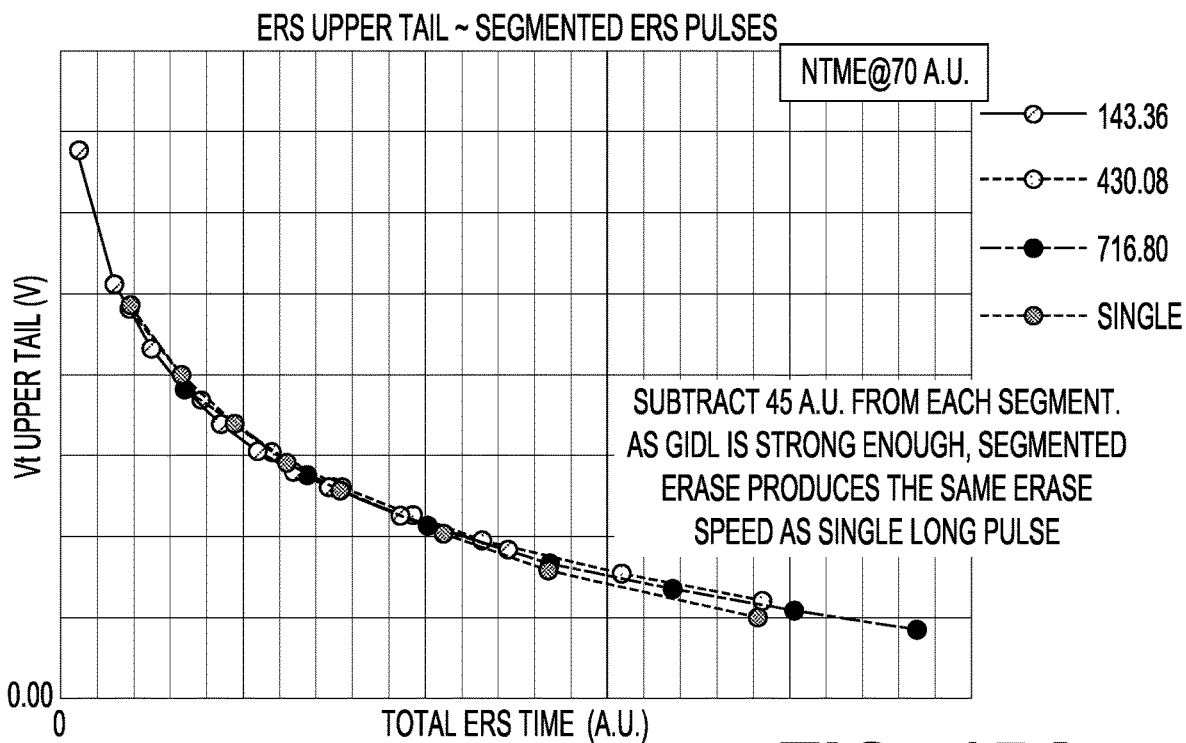
FIGS. 15A and 15B show a further comparison of many short erase pulses or the plurality of voltage segments of the erase signal to the single long erase pulse according to aspects of the disclosure.
Figure 15B:
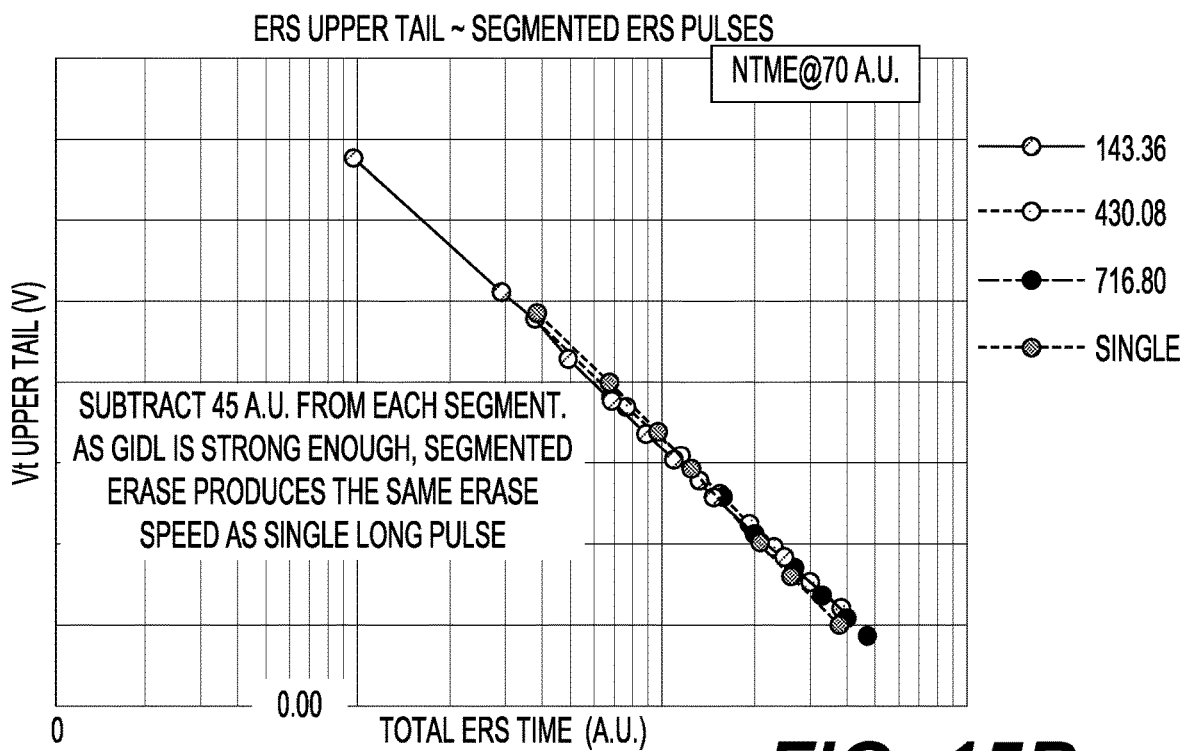

FIGS. 15A and 15B show a further comparison of many short erase pulses or the plurality of voltage segments of the erase signal to the single long erase pulse. The data shown in FIG. 15A and 15B is similar to in FIGS. 14A and 14B; however, for each of the plurality of voltage segments or erase segments, a fixed timing of 45 a.u. was subtracted from its duration. After this shortening, it is believed the total erase time period (NTME) will be the same as a single erase pulse erase time period with the erase signal being a single continuous pulse. Again, some difference (~150 a.u.) of the upper tail is observed between the segmented erase and the single long pulse erase operation. Thus, overall it is not as preferable to employ segmented erase operation as some of the downsides can include either a slower erase, or a longer erase time period in total.

Accordingly, provided herein is a memory apparatus (e.g., non-volatile storage device 510 of FIG. 5) including memory cells (e.g., storage elements 323-326, 343-346, 363-366 of FIG. 3) connected to word lines (e.g., WL3, WL2, WL1 and WL0 of FIG. 3) and bit lines (e.g., bit lines 321, 341 and 361 of FIG. 3) and arranged in strings (e.g., NAND strings 320, 340 and 360 of FIG. 3). The memory cells are configured to retain a threshold voltage $V_{TH}$. Each of the memory cells is also configured to be erased in an erase operation occurring during an erase time period. A control circuit (e.g., controller 544, control circuitry 520, read/write circuits 530A and 530B of FIG. 5) is coupled to the word lines and the bit lines and is configured to adjust at least a portion of the erase time period in response to determining the erase operation is a segmented erase operation and is resumed after being suspended. The control circuit is also configured to apply an erase signal having a plurality of voltage segments temporally separated from one another during the erase time period to each of the strings (e.g., Signal$_2$, Signal$_3$, Signal$_4$, and Signal$_5$ in FIG. 13D) while simultaneously applying a word line erase voltage to selected ones of the word lines to encourage erasing of the memory cells coupled to the selected ones of the word lines in the segmented erase operation. As discussed above, the word line erase voltage can be zero volts (i.e., grounded) or some non-zero value.

While in a typical erase pulse, a significant amount of the total pulse time includes "real" erase time, some amount of the total pulse time is necessary for bias ramp-up and stabilization. As shown, the at least the portion of the erase time period includes a ramping time portion or erase bias ramp up time in which the erase signal applied to each of the strings is ramped from a pre-charge voltage level to a target erase voltage level.

As discussed above, the root cause of the slower erase from a segmented erase is the insufficient ramp up time for the current or default device setting. It is possible to set the erase bias ramp up time or ramping time portion to compensate this. In other words, it is likely that if segmented erase could have similar erase speed if the ramping time portion is elongated. However, if the erase pulse is a conventional long pulse, it is not necessary to have a long ramping time portion.

Figure 16:
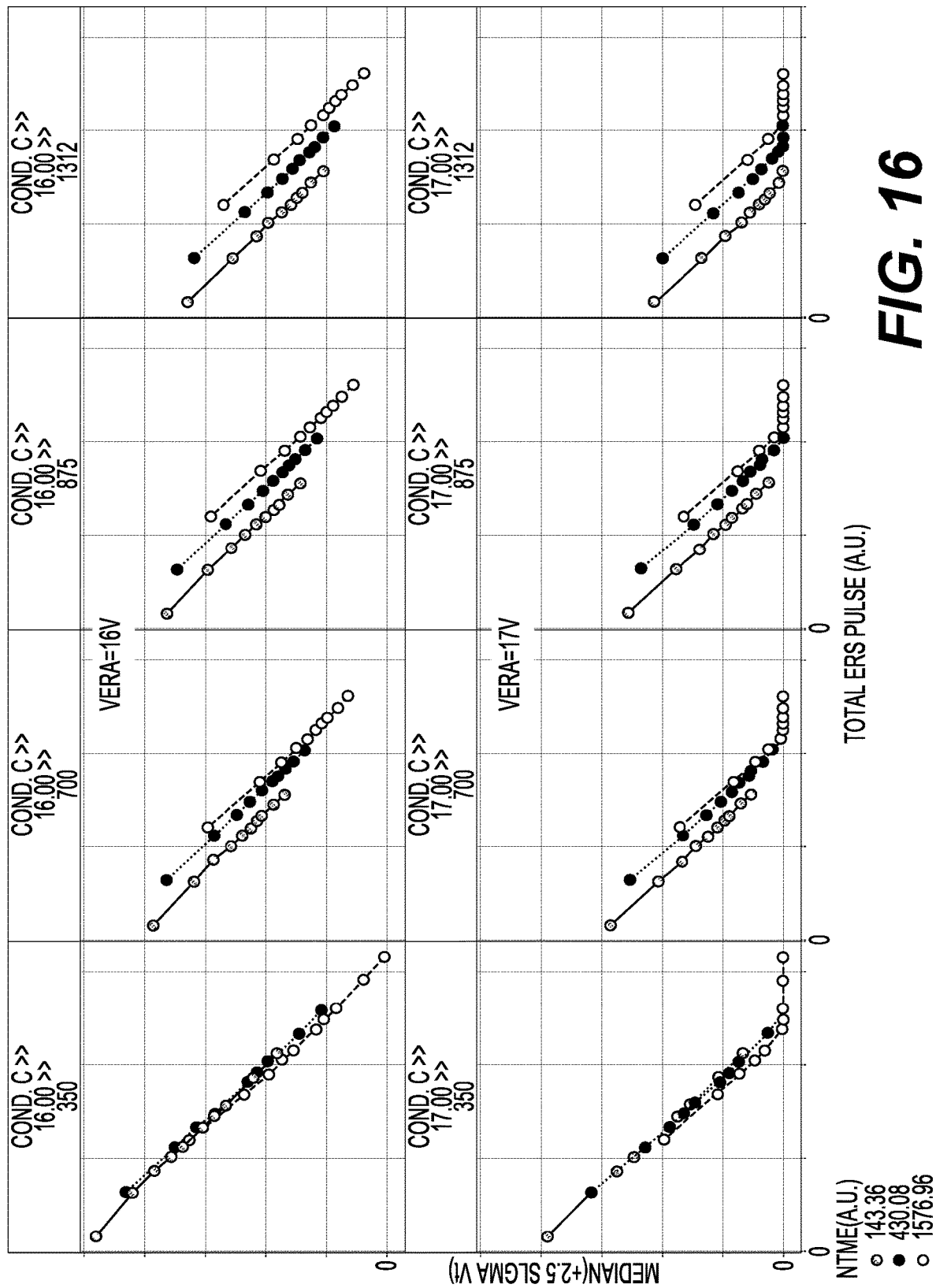
FIG. 16 shows a plot of threshold voltage versus the total erase time period for memory cells that have experienced the segmented erase operation with different total erase time periods and using different magnitudes of a target erase voltage level or erase voltage according to aspects of the disclosure.

FIG. 16 shows a plot of threshold voltage $V_{TH}$ versus the total erase time period for memory cells that have experienced the segmented erase operation with different total erase time periods (NTME) and using different magnitudes of a target erase voltage level or erase voltage VERA. The total erase time period or total ERS pulse time in the plots (X-axis) only counts the NTME part. In the plots shown, the ramping time portion was changed by a timer overload. As expected, with a relatively shorter ramping time portion (350 a.u.), the segmented operation with more shorter pulses produces a slower erase speed, as the ramping time portion is too short for the erase voltage VERA ramp-up. Thus, for each total erase time period, the effective erase voltage VERA time is shorter.

Figure 17A:
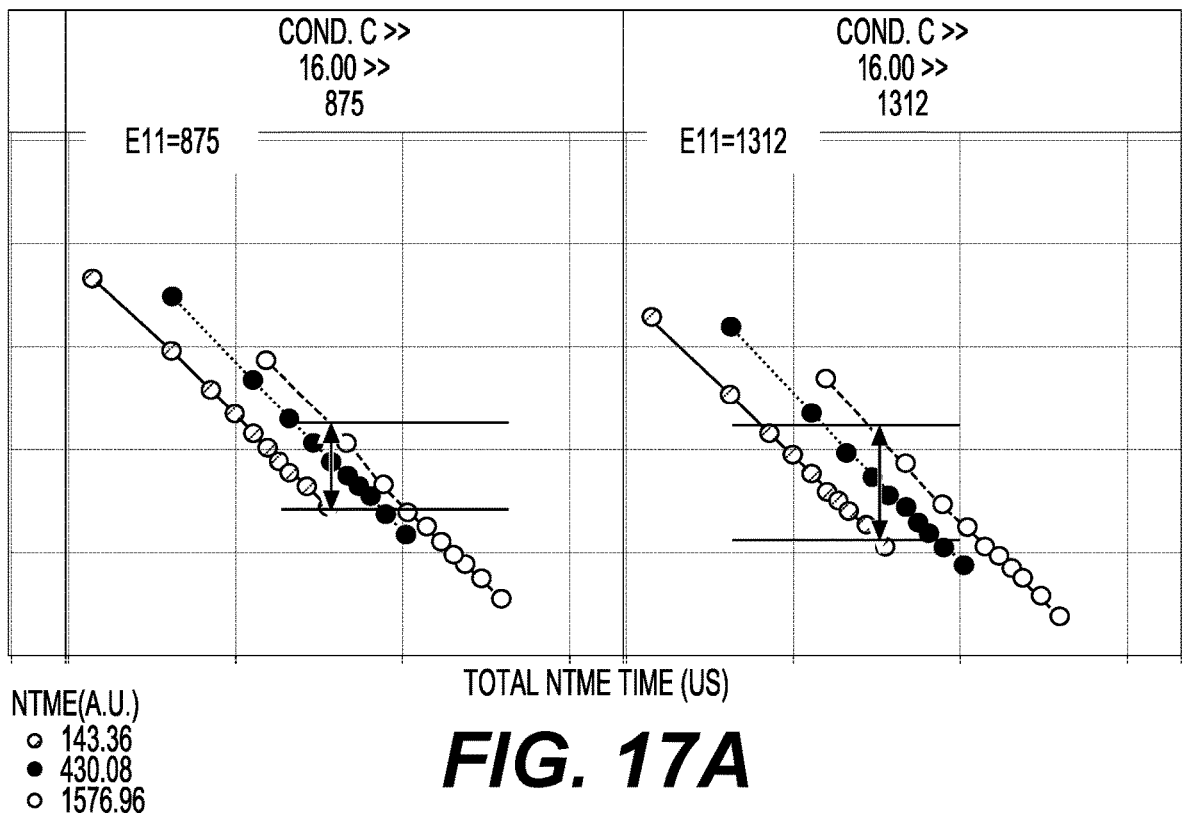
FIGS. 17A shows a plot of threshold voltage versus the total erase time period for memory cells that have experienced the segmented erase operation with different total erase time periods and using different magnitudes of a target erase voltage level or erase voltage according to aspects of the disclosure.
Figure 17B:
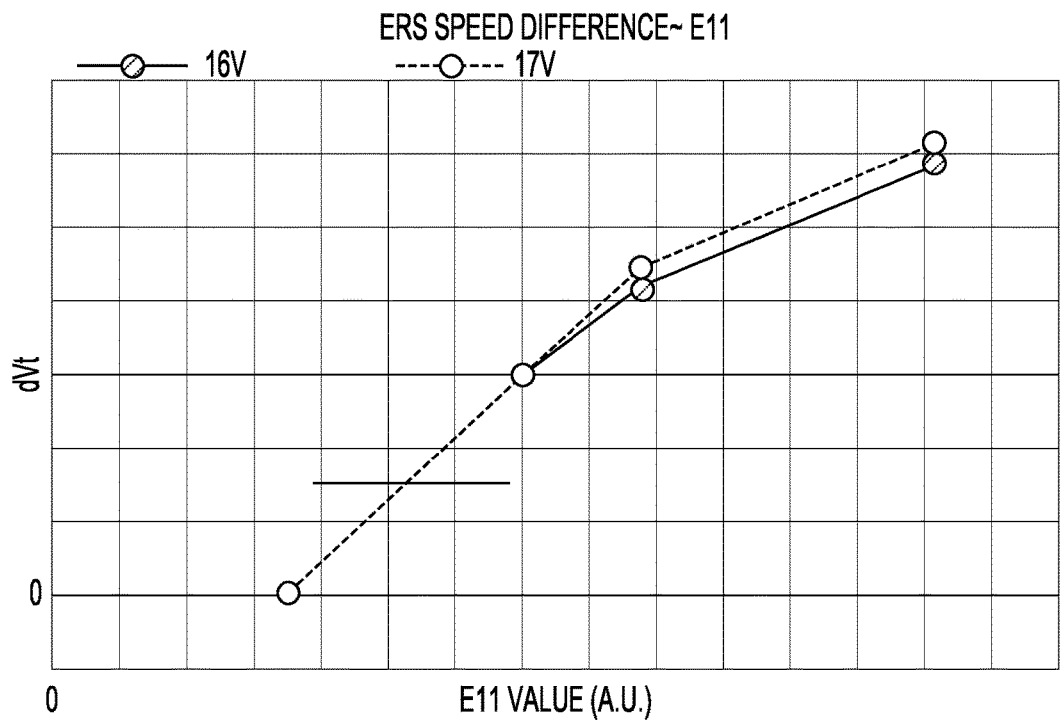
FIG. 17B shows a plot of a change in threshold voltage versus the ramping time portion for memory cells that have experienced the segmented erase operation with different magnitudes of the target erase voltage level or erase voltage according to aspects of the disclosure.
Figure 18:
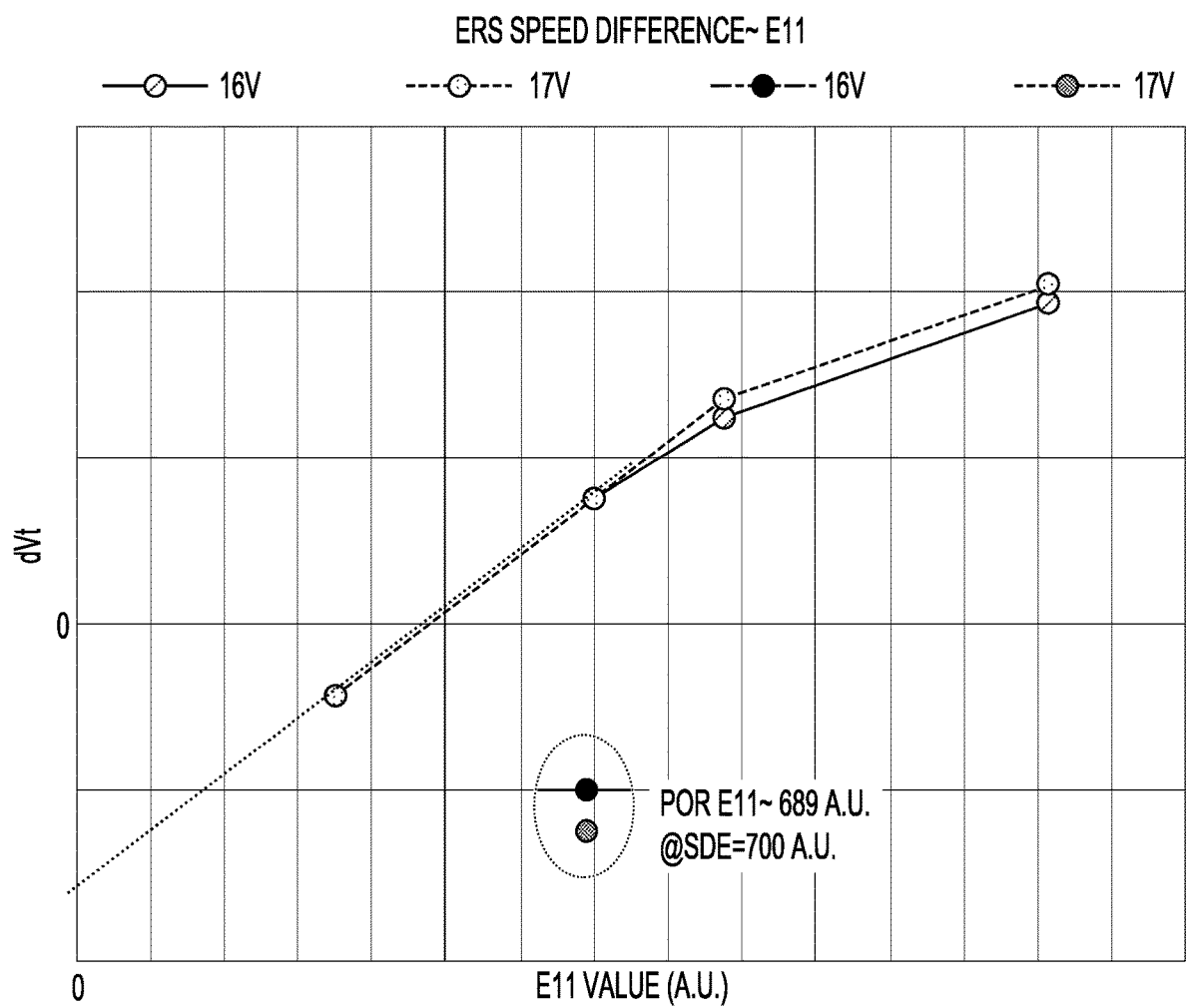
FIG. 18 shows another plot of the change in threshold voltage versus the ramping time portion for memory cells that have experienced the segmented erase operation with different magnitudes of the target erase voltage level or erase voltage according to aspects of the disclosure.

FIGS. 17A shows a plot of threshold voltage $V_{TH}$ versus the total erase time period for memory cells that have experienced the segmented erase operation with different total erase time periods (NTME) and using different magnitudes of a target erase voltage level or erase voltage VERA. FIG. 17B shows a plot of a change in threshold voltage $V_{TH}$ versus the ramping time portion (indicated as E11) for memory cells that have experienced the segmented erase operation with different magnitudes of the target erase voltage level or erase voltage VERA. Similarly, FIG. 18 shows another plot of the change in threshold voltage $V_{TH}$ versus the ramping time portion (indicated as E11) for memory cells that have experienced the segmented erase operation with different magnitudes of the target erase voltage level or erase voltage VERA. Although outlier data points that do not appear to fit in the curve are shown, it is likely that instead of being at around 689 a.u., the data points are actually at approximately 150 a.u. Again, the erase speed with repeated short pulses (i.e., segment erase operation) is slower because the default ramping time portion is not enough to ramp up to target erase voltage level VERA. As the ramping time portion increases further, the trend is flipped since elongated ramping time portion itself contributes to total erase time significantly.

Accordingly, the ramping time portion can have an associated parameter of the memory apparatus that may be modified. Specifically the ramping time portion is elongated when the segmented erase operation is resumed. In other words, the length of the ramping time portion or clock (VERA rampup) is increased to compensate the overhead time, at the cost of longer single on the plurality of voltage segments. So, according to an aspect, the control circuit is further configured to elongate the ramping time portion in response to determining the segmented erase operation is resumed after being suspended.

In some memory apparatuses, the ramping time portion may not a parameter that be easily changed. One possible solution could be to use an offset (increase) of the total erase time period NTME if the system or state machine knows the erase pulse is a "resume" erase one. Specifically, an extra timing parameter called DNTME_RESUME may be used only in a resumed segmented erase, to elongate the segment duration of that particular voltage segment (thereby elongating the total erase time period NTME). This requires that the control circuit has the intelligence to know (remember) if a voltage segment is after a "resume" or not. If it is after a "resume", for that particular resumed voltage segment, the segment duration or NTME_segment=normal NTME_segment or a default segment duration+DNTME_RESUME. The at least the portion of the erase time period also includes a segmented time portion in which the plurality of voltage segments temporally separated from one another are applied to each of the strings. The plurality of voltage segments each have a magnitude of a target erase voltage level and a segment duration. Thus, the control circuit is further configured to elongate the segment duration of at least one of the plurality of voltage segments during the segmented time portion in response to determining the segmented erase operation is resumed after being suspended.

More specifically, according to an aspect, the control circuit is further configured to determine and store whether each of the plurality of voltage segments during the segmented time portion occurs before the segmented erase operation is suspended or after the segmented erase operation is resumed. Thus, referring back to FIG. 11B, the control circuit (e.g., state machine 522 of FIG. 5) remembers how many of the plurality of voltage segments have passed before the segmented erase operation is suspended (e.g., segment n of FIG. 11B). These voltage segments will be skipped next time when segmented erase operation resumes (e.g., the control circuit will begin with voltage segment n+1 of FIG. 11B after resuming).

The at least one of the plurality of voltage segments includes a first one of the plurality of voltage segments immediately after resuming and the control circuit is configured to elongate the segment duration (i.e., NTME_segment) of the first one of the plurality of voltage segments immediately after resuming during the segmented time portion in response to determining the first one of the plurality of voltage segments immediately after resuming occurs after the segmented erase operation is resumed. Consequently, if the control circuit (e.g., state machine (FSM)) knows a segmented erase operation is being resumed, the segment duration or NTME_segment will be offset (positive, slightly longer) by the value DNTME_RESUME. FIG. 19 is a table with a plurality of offset values DNTME_RESUME (e.g., DT1, DT2, etc.) that may be referenced by the control circuit to elongate a segment duration (i.e., NTME_segment) of one of a plurality of voltage segments. Consequently, after some time overhead consideration, the segmented erase operation can produce very close erase speed as a regular long VERA pulse.

As discussed above, referring back to FIGS. 13A, 13B, 15A and 15B, the segmented erase operation has slower erase speed. However, if a fixed timing (~50 a.u.) is subtracted from every voltage segment, then the segmented erase operation can erase a block at the same speed as a regular or traditional long VERA pulse (i.e., non-segmented). Thus, according to an aspect, the control circuit is further configured to shorten the segment duration of each of the plurality of voltage segments temporally separated from one another by an amount of time selected to increase a segmented erase speed and approximate a single erase pulse erase speed with the erase signal being a single continuous pulse.

According to an aspect, another option is to pad using one or more of the plurality of voltage segments when the segmented erase operation is resumed. In other words, extra ones of the plurality of voltage segments or VERA segments may be utilized. More specifically, the quantity of the plurality of segments used can be associated with a parameter EXTRA_SEGMENT. So, according to an aspect, the control circuit is further configured to increase a quantity of the plurality of voltage segments temporally separated from one another (by number of extra voltage segments corresponding to the parameter EXTRA_SEGMENT) in response to determining the segmented erase operation is resumed after being suspended. FIG. 20 is a table with a plurality of parameter EXTRA_SEGMENT that may be referenced by the control circuit to increase the quantity of the plurality of voltage segments.

Figure 21:
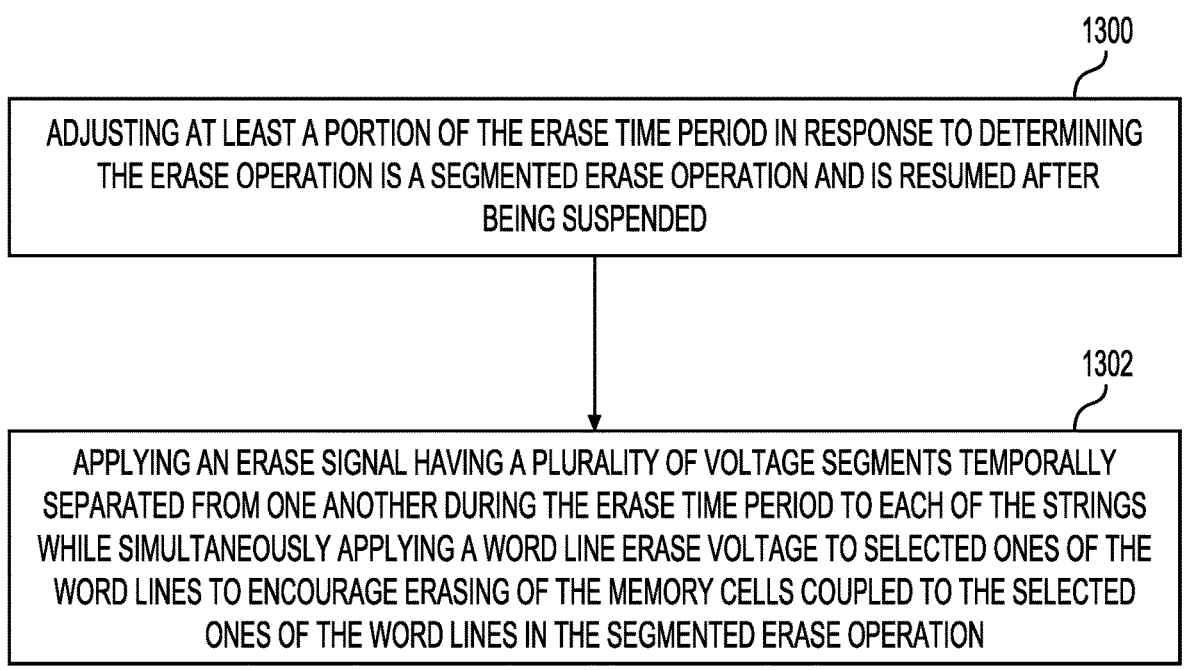
FIG. 21 illustrates steps of a method of operating the memory apparatus according to aspects of the disclosure.

Referring now to FIG. 21, a method of operating a memory apparatus (e.g., memory system 100 of FIGS. 1A-2B) is also provided. As above, the memory apparatus (e.g., non-volatile storage device 510 of FIG. 5) includes memory cells (e.g., storage elements 323-326, 343-346, 363-366 of FIG. 3) connected to word lines (e.g., WL3, WL2, WL1 and WL0 of FIG. 3) and bit lines (e.g., bit lines 321, 341 and 361 of FIG. 3) and arranged in strings (e.g., NAND strings 320, 340 and 360 of FIG. 3). The memory cells are configured to retain a threshold voltage $V_{TH}$. Each of the memory cells is also configured to be erased in an erase operation occurring during an erase time period. The method includes the step of 1300 adjusting at least a portion of the erase time period in response to determining the erase operation is a segmented erase operation and is resumed after being suspended. The method continues with the step of 1302 applying an erase signal having a plurality of voltage segments temporally separated from one another during the erase time period to each of the strings (e.g., $Signal_2$, $Signal_3$, $Signal_4$, and $Signal_5$ in FIG. 13D) while simultaneously applying a word line erase voltage to selected ones of the word lines to encourage erasing of the memory cells coupled to the selected ones of the word lines in the segmented erase operation.

As discussed, the at least the portion of the erase time period includes a segmented time portion in which the plurality of voltage segments temporally separated from one another are applied to each of the strings. The plurality of voltage segments each have a magnitude of a target erase voltage level and a segment duration. Thus, the method further includes the step of elongating the segment duration of at least one of the plurality of voltage segments during the segmented time portion in response to determining the segmented erase operation is resumed after being suspended.

The method also includes the step of determining and storing whether each of the plurality of voltage segments during the segmented time portion occurs before the segmented erase operation is suspended or after the segmented erase operation is resumed. Again, the at least one of the plurality of voltage segments includes a first one of the plurality of voltage segments immediately after resuming. So, the method further includes the step of elongating the segment duration of the first one of the plurality of voltage segments immediately after resuming during the segmented time portion in response to determining the first one of the plurality of voltage segments immediately after resuming occurs after the segmented erase operation is resumed.

Referring back to FIGS. 13A, 13B, 15A and 15B, a fixed timing (~50 a.u.) may subtracted from every voltage segment so that the segmented erase operation can erase a block at the same speed as a regular or traditional long VERA pulse (i.e., non-segmented). Therefore, the method further includes the step of shortening the segment duration of each of the plurality of voltage segments temporally separated from one another by an amount of time selected to increase a segmented erase speed and approximate a single erase pulse erase speed with the erase signal being a single continuous pulse.

As discussed, the at least the portion or erase bias ramp up time of the erase time period includes a ramping time portion in which the erase signal applied to each of the strings is ramped from a pre-charge voltage level to a target erase voltage level. Consequently, the method further includes the step of elongating the ramping time portion in response to determining the segmented erase operation is resumed after being suspended.

Again, one or more of the plurality of voltage segments may be added when the segmented erase operation is resumed. So, the method further includes the step of increasing a quantity of the plurality of voltage segments temporally separated from one another in response to determining the segmented erase operation is resumed after being suspended.

While segmented erase operations may in general be slower than a regular long pulse erase, after some overhead calibration, segmented erase operations can actually produce a very close erase speed as compared to a regular long erase voltage VERA pulse (i.e., non-segmented). The options discussed above for adjusting at least a portion of the erase time period (e.g., elongating the ramping time portion, elongating the segment duration of a particular voltage segment, and using extra ones of the plurality of voltage segments) will ensure the total erase time in a segmented erase resumed after suspend is comparable to regular long erase voltage VERA pulse, and do not cause an erase time penalty in conventional long erase pulse (namely, there is no suspend/resume in that erase operation). It should be appreciated that the options discussed above can work either alone or combined with one another (i.e., work as a group).

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
   memory cells connected to word lines and bit lines and arranged in strings and configured to retain a threshold voltage, each of the memory cells configured to be erased in an erase operation occurring during an erase time period;
   a control circuit coupled to the word lines and the strings and configured to:
      adjust at least a portion of the erase time period in response to determining the erase operation is a segmented erase operation and is resumed after being suspended, and
      apply an erase signal having a plurality of voltage segments temporally separated from one another during the erase time period to each of the strings while simultaneously applying a word line erase voltage to selected ones of the word lines to encourage erasing of the memory cells coupled to the selected ones of the word lines in the segmented erase operation.

2. The memory apparatus as set forth in claim 1, wherein the at least the portion of the erase time period includes a segmented time portion in which the plurality of voltage segments temporally separated from one another are applied to each of the strings and the plurality of voltage segments each have a magnitude of a target erase voltage level and a segment duration and the control circuit is further configured to elongate the segment duration of at least one of the plurality of voltage segments during the segmented time portion in response to determining the segmented erase operation is resumed after being suspended.

3. The memory apparatus as set forth in claim 2, wherein the control circuit is further configured to determine and store whether each of the plurality of voltage segments during the segmented time portion occurs before the segmented erase operation is suspended or after the segmented erase operation is resumed.

4. The memory apparatus as set forth in claim 3, wherein the at least one of the plurality of voltage segments includes a first one of the plurality of voltage segments immediately after resuming and the control circuit is configured to elongate the segment duration of the first one of the plurality of voltage segments immediately after resuming during the segmented time portion in response to determining the first one of the plurality of voltage segments immediately after resuming occurs after the segmented erase operation is resumed.

5. The memory apparatus as set forth in claim 2, wherein the control circuit is further configured to shorten the segment duration of each of the plurality of voltage segments temporally separated from one another by an amount of time selected to increase a segmented erase speed and approximate a single erase pulse erase speed with the erase signal being a single continuous pulse.

6. The memory apparatus as set forth in claim 1, wherein the at least the portion of the erase time period includes a ramping time portion in which the erase signal applied to each of the strings is ramped from a pre-charge voltage level to a target erase voltage level and the control circuit is further configured to elongate the ramping time portion in response to determining the segmented erase operation is resumed after being suspended.

7. The memory apparatus as set forth in claim 1, wherein the control circuit is further configured to increase a quantity of the plurality of voltage segments temporally separated from one another in response to determining the segmented erase operation is resumed after being suspended.

8. A controller in communication with a memory apparatus including memory cells connected to word lines and bit lines and arranged in strings and configured to retain a threshold voltage, each of the memory cells configured to be erased in an erase operation occurring during an erase time period, the controller configured to:
  instruct the memory apparatus to adjust at least a portion of the erase time period in response to determining the erase operation is a segmented erase operation and is resumed after being suspended; and
  instruct the memory apparatus to apply an erase signal having a plurality of voltage segments temporally separated from one another during the erase time period to each of the strings while simultaneously applying a word line erase voltage to selected ones of the word lines to encourage erasing of the memory cells coupled to the selected ones of the word lines in the segmented erase operation.

9. The controller as set forth in claim 8, wherein the at least the portion of the erase time period includes a segmented time portion in which the plurality of voltage segments temporally separated from one another are applied to each of the strings and the plurality of voltage segments each have a magnitude of a target erase voltage level and a segment duration and the controller is further configured to instruct the memory apparatus to elongate the segment duration of at least one of the plurality of voltage segments during the segmented time portion in response to determining the segmented erase operation is resumed after being suspended.

10. The controller as set forth in claim 9, wherein the controller is further configured to determine and store whether each of the plurality of voltage segments during the segmented time portion occurs before the segmented erase operation is suspended or after the segmented erase operation is resumed.

11. The controller as set forth in claim 10, wherein the at least one of the plurality of voltage segments includes a first one of the plurality of voltage segments immediately after resuming and the controller is further configured to instruct the memory apparatus to elongate the segment duration of the first one of the plurality of voltage segments immediately after resuming during the segmented time portion in response to determining the first one of the plurality of voltage segments immediately after resuming occurs after the segmented erase operation is resumed.

12. The controller as set forth in claim 8, wherein the at least the portion of the erase time period includes a ramping time portion in which the erase signal applied to each of the strings is ramped from a pre-charge voltage level to a target erase voltage level and the controller is further configured to instruct the memory apparatus to elongate the ramping time portion in response to determining the segmented erase operation is resumed after being suspended.

13. The controller as set forth in claim 8, wherein the controller is further configured to instruct the memory apparatus to increase a quantity of the plurality of voltage segments temporally separated from one another in response to determining the segmented erase operation is resumed after being suspended.

14. A method of operating a memory apparatus including memory cells connected to word lines and bit lines and arranged in strings and configured to retain a threshold voltage, each of the memory cells configured to be erased in an erase operation occurring during an erase time period, the method comprising the steps of:
  adjusting at least a portion of the erase time period in response to determining the erase operation is a segmented erase operation and is resumed after being suspended; and
  applying an erase signal having a plurality of voltage segments temporally separated from one another during the erase time period to each of the strings while simultaneously applying a word line erase voltage to selected ones of the word lines to encourage erasing of the memory cells coupled to the selected ones of the word lines in the segmented erase operation.

15. The method as set forth in claim 14, wherein the at least the portion of the erase time period includes a segmented time portion in which the plurality of voltage segments temporally separated from one another are applied to each of the strings and the plurality of voltage segments each have a magnitude of a target erase voltage level and a segment duration and the method further includes the step of elongating the segment duration of at least one of the plurality of voltage segments during the segmented time portion in response to determining the segmented erase operation is resumed after being suspended.

16. The method as set forth in claim 15, further including the step of determining and storing whether each of the plurality of voltage segments during the segmented time portion occurs before the segmented erase operation is suspended or after the segmented erase operation is resumed.

17. The method as set forth in claim 16, wherein the at least one of the plurality of voltage segments includes a first one of the plurality of voltage segments immediately after resuming and the method further includes the step of elongating the segment duration of the first one of the plurality of voltage segments immediately after resuming during the segmented time portion in response to determining the first one of the plurality of voltage segments immediately after resuming occurs after the segmented erase operation is resumed.

18. The method as set forth in claim 15, further including the step of shortening the segment duration of each of the plurality of voltage segments temporally separated from one another by an amount of time selected to increase a segmented erase speed and approximate a single erase pulse erase speed with the erase signal being a single continuous pulse.

19. The method as set forth in claim 14, wherein the at least the portion of the erase time period includes a ramping time portion in which the erase signal applied to each of the strings is ramped from a pre-charge voltage level to a target erase voltage level and the method further includes the step of elongating the ramping time portion in response to determining the segmented erase operation is resumed after being suspended.

20. The method as set forth in claim 14, further including the step of increasing a quantity of the plurality of voltage segments temporally separated from one another in response to determining the segmented erase operation is resumed after being suspended.

\* \* \* \* \*